United States Patent
Tien et al.

(10) Patent No.: US 8,075,257 B2
(45) Date of Patent: Dec. 13, 2011

(54) FAN ASSEMBLY

(75) Inventors: Chi-Wei Tien, Taipei (TW); Chun-Hung Huang, Taipei (TW); Chien-Ming Su, Taipei (TW); Wen-Yu Wu, Taipei (TW); Min-Yuan Lin, Taipei (TW)

(73) Assignee: Compal Electronics, Inc., Taipei (TW)

( * ) Notice: Subject to any disclaimer, the term of this patent is extended or adjusted under 35 U.S.C. 154(b) by 524 days.

(21) Appl. No.: 12/356,078

(22) Filed: Jan. 20, 2009

(65) Prior Publication Data

US 2010/0025022 A1    Feb. 4, 2010

(30) Foreign Application Priority Data

Jul. 30, 2008   (TW) ............................... 97128875 A

(51) Int. Cl.
*F01D 1/02* (2006.01)
*F03B 1/04* (2006.01)
*F03B 3/16* (2006.01)
*F03D 1/04* (2006.01)
*F03D 3/04* (2006.01)
*F04D 29/44* (2006.01)
*F04D 29/54* (2006.01)

(52) U.S. Cl. ............ 415/185; 415/13; 415/203; 165/121

(58) Field of Classification Search ............. 417/423.14; 415/13, 183, 185, 119, 203, 205, 208.1; 165/121, 165/276; 361/695

See application file for complete search history.

(56) References Cited

U.S. PATENT DOCUMENTS

| | | | | |
|---|---|---|---|---|
| 3,751,179 A * | 8/1973 | Wassmann | ................... | 415/228 |
| 4,756,668 A * | 7/1988 | Gassen et al. | ............. | 416/247 R |
| 5,026,251 A * | 6/1991 | Kinoshita et al. | ............. | 415/119 |
| D443,054 S * | 5/2001 | Spaggiari | ..................... | D23/370 |
| 6,679,686 B2 * | 1/2004 | Wang | ........................ | 417/423.1 |
| 6,905,304 B2 * | 6/2005 | Park | .......................... | 415/173.1 |
| 6,955,521 B2 * | 10/2005 | Yang | .............................. | 415/4.2 |
| 7,360,992 B2 * | 4/2008 | Cho | ............................. | 415/220 |
| 7,458,415 B2 * | 12/2008 | Hashimoto et al. | .......... | 165/80.3 |
| 7,497,659 B2 * | 3/2009 | Hsu et al. | ...................... | 415/183 |
| 7,780,404 B2 * | 8/2010 | Horng et al. | ................. | 415/191 |
| 2002/0090308 A1 * | 7/2002 | Cheng | ........................ | 417/423.1 |
| 2010/0220445 A1 * | 9/2010 | Fujiwara | ..................... | 361/695 |

FOREIGN PATENT DOCUMENTS

CN    1917754    2/2007

OTHER PUBLICATIONS

"1st Office Action of China Counterpart Application", issued on Dec. 21, 2010, p. 1-p. 3.

* cited by examiner

*Primary Examiner* — Chris Chu
(74) *Attorney, Agent, or Firm* — Jianq Chyun IP Office

(57) ABSTRACT

A fan assembly for use in an electronic device is provided. The fan assembly includes a housing, a fan, a throttle valve, and a regulator. The housing has an outlet. The fan is disposed in the housing and adapted to provide an air current. The air current generates an air volume through the outlet. The throttle valve is movably disposed in the housing at the outlet. The regulator is connected to the throttle valve to control the movement of the throttle valve to adjust the size of the outlet.

20 Claims, 25 Drawing Sheets

FAN ASSEMBLY

CROSS-REFERENCE TO RELATED APPLICATION

This application claims the priority benefit of Taiwan application serial no. 97128875, filed Jul. 30, 2008. The entirety of the above-mentioned patent application is hereby incorporated by reference herein and made a part of specification.

BACKGROUND OF THE INVENTION

1. Field of the Invention

The present invention generally relates to a fan assembly, and more particularly, to a fan assembly for use in an electronic device.

2. Description of Related Art

In recent years, there has been a trend toward miniaturization and multifunction in the development of portable electronic devices. To provide more powerful function, the portable electronic device typically employs a higher speed chip which generally generates more heat. The more heat generated by the chip and the miniaturization of the portable electronic device make the cooling of portable electronic device critically important.

As a common device used in the electronics cooling technology, a fan is often used in combination with a heat sink to cool a high power device to maintain the temperature of the device within a normal temperature range. In addition, when the fan generates an air current, convection is resulted between the air in an interior of the electronic device and the air in an outer environment, thereby effectively decreasing the temperature of the interior of the electronic device.

To concentrate the air current, a housing in which the fan is mounted is usually provided with an outlet, and the shape and size of the outlet are usually fixed. Therefore, to provide a high speed air current to a specific area (e.g., a specific portion of the electronic component), the only solution is to increase the fan speed. In this case, however, the air current generated by the fan can not be utilized to its fullest extent, thereby decreasing the efficiency of the fan.

SUMMARY OF THE INVENTION

The present invention provides a fan assembly for use in an electronic device. The fan assembly includes a housing, a fan, a throttle valve, and a regulator. The fan includes a first axle and may be a centrifugal fan or an axial fan. The housing has a first outlet. The fan is disposed in the housing and adapted to provide an air current. The air current generates a first air volume through the first outlet. When the fan is a centrifugal fan, the direction of the air current is perpendicular to the axle of the fan. When the fan is an axial fan, the direction of the air current is parallel to the axle of the fan. The throttle valve is movably disposed in the housing at the outlet. The regulator is connected to the throttle valve to control the movement of the throttle valve to adjust the size of the outlet.

According to one embodiment of the present invention, the housing further includes a second outlet, and the air current generates a second air volume through the second outlet. The regulator controls the throttle valve to adjust the size of the first outlet and the size of the second outlet, thereby adjusting the first air volume and the second air volume.

In view of the foregoing, the fan assembly of the present invention includes the throttle valve disposed at the outlet and controls the size of the outlet by controlling the movement of the throttle valve with the regulator. When the fan speed is changed, the throttle valve can cause expansion or concentration of the air current in response to a change in the intensity of the air current. In addition, when the fan is rotated at a fixed speed, the throttle valve can adjust the air volume through the outlet. Therefore, the user can more flexibly control the air current, thereby increasing the efficiency of the fan assembly.

In order to make the aforementioned and other features and advantages of the present invention more comprehensible, embodiments accompanied with figures are described in detail below.

DESCRIPTION OF THE EMBODIMENTS

Figure 1A:
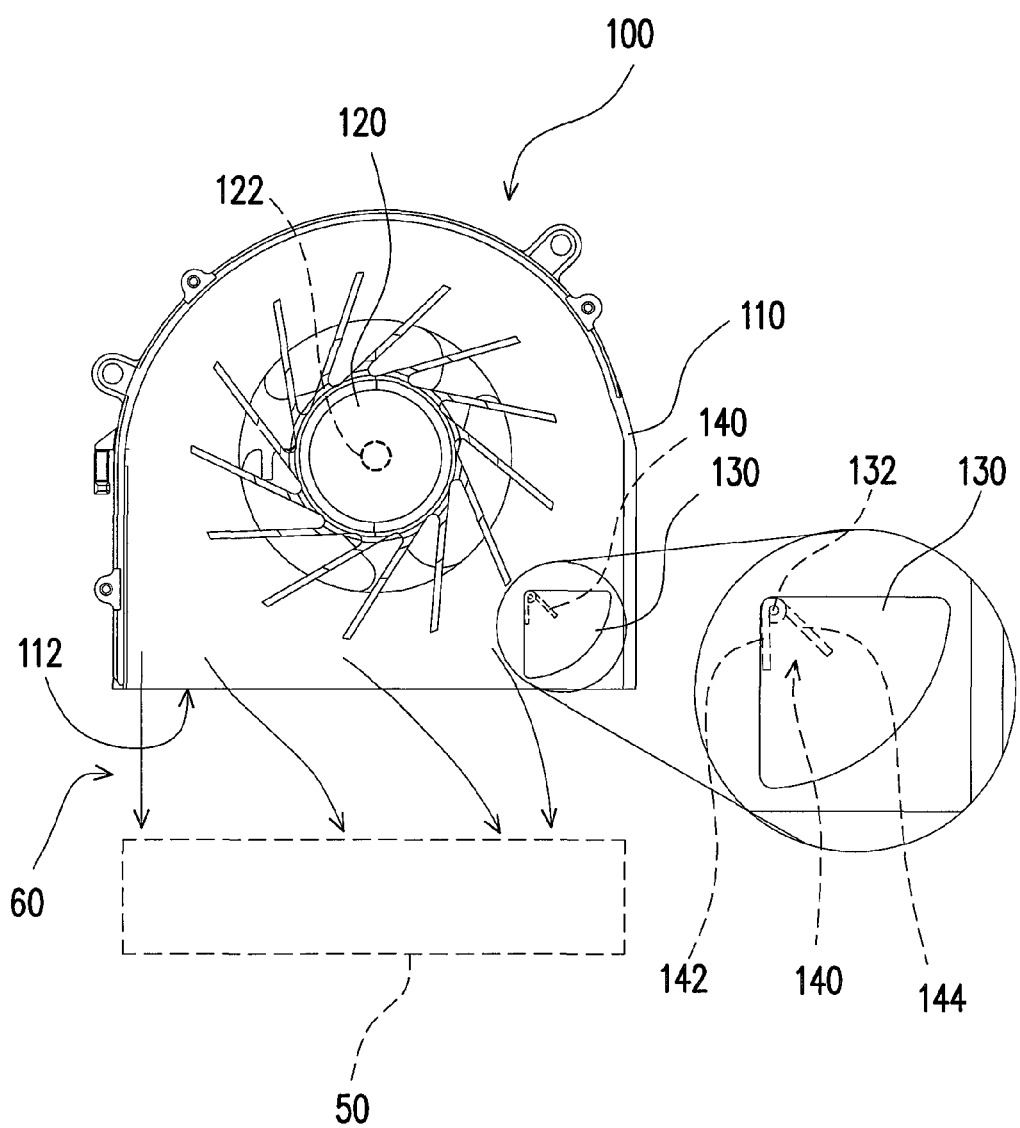
FIGS. 1A to 1C illustrate a fan assembly according to one embodiment of the present invention.
Figure 1B:
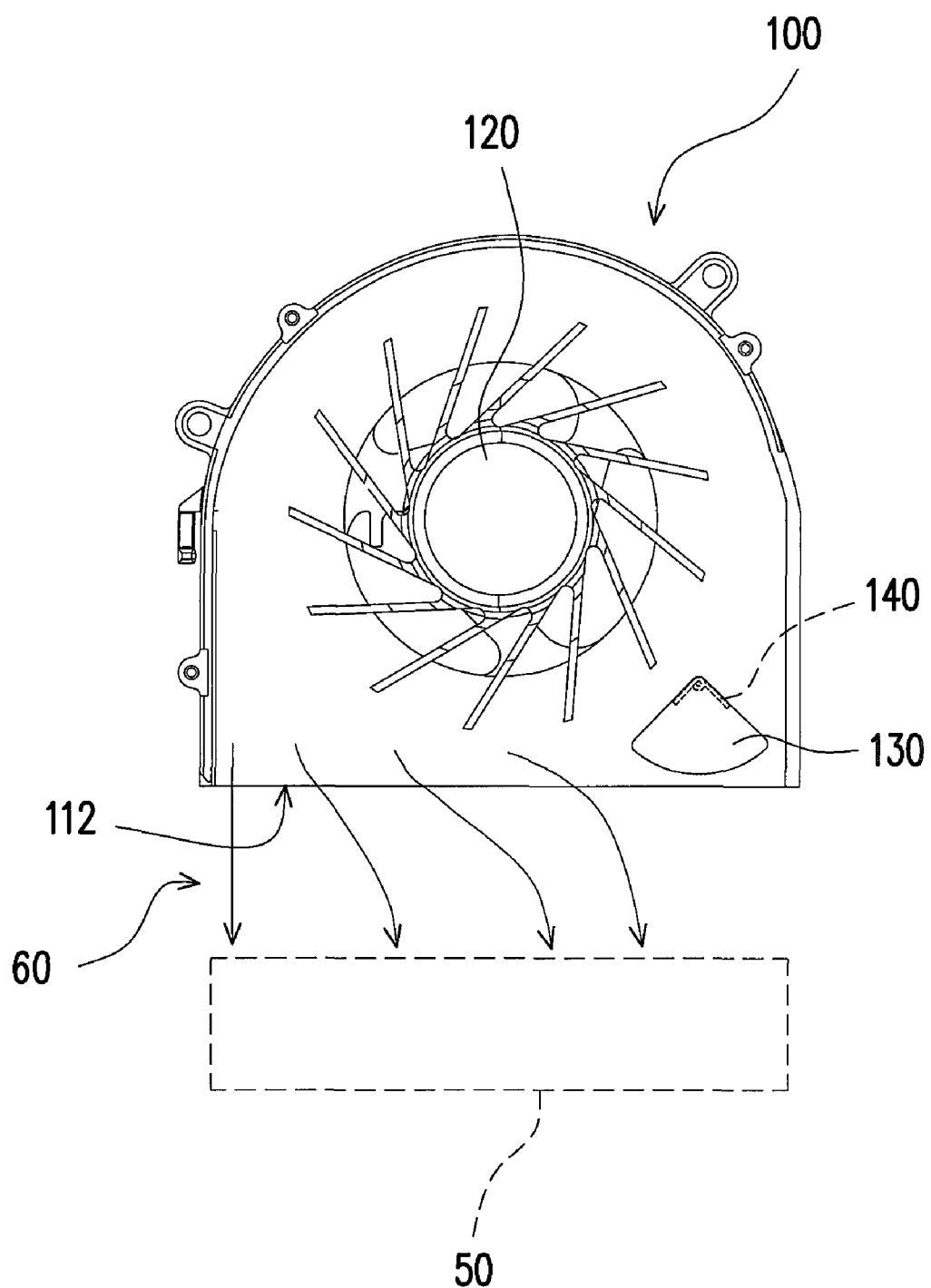
Figure 1C:
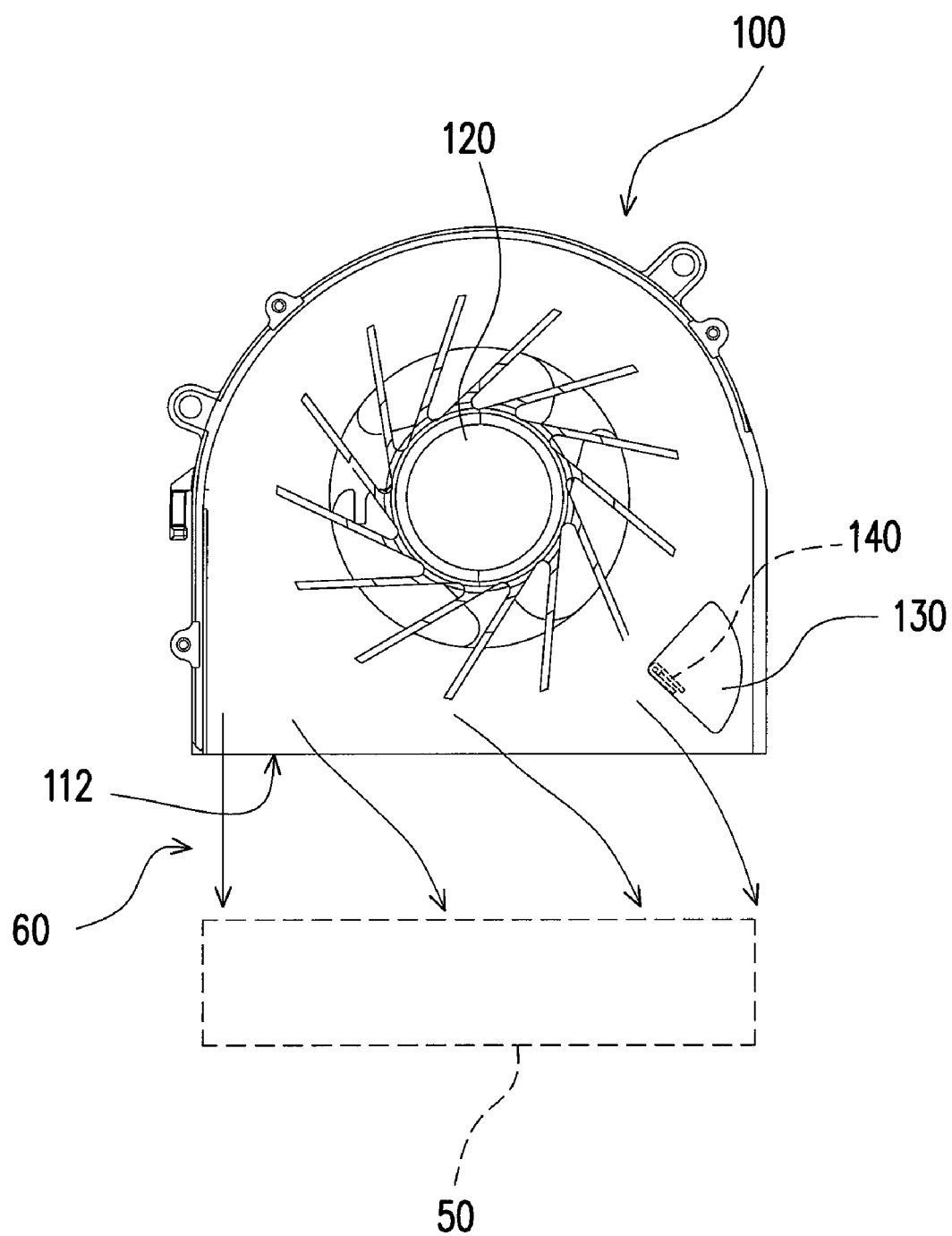

FIGS. 1A to 1C illustrate a fan assembly according to one embodiment of the present invention. It should be understood that, while only a portion of a fan housing is illustrated in the drawings for the sake of clarity, those skilled in the art are capable of practicing the present invention upon reading the disclosure herein. Referring to FIG. 1, the fan assembly 100 includes a housing 110, a fan 120, a throttle valve 130, and a restoring member 140. The fan 120 includes an axle 122 and may be a centrifugal fan or an axial fan. In the present embodiment, the fan 120 is a centrifugal fan and the restoring member 140 can be considered a component of a regulator. The housing 110 has an airflow outlet 112, and the fan 120 is disposed within the housing 110. Specifically, the fan 120 can generate an air current exiting the housing 110 through the outlet 112. The air current generates an air volume 60 at the outlet 112. When the fan 120 is a centrifugal fan, the direction of the air current is perpendicular to the axle 122 of the fan. When the fan 120 is an axial fan, the direction of the air current is parallel to the axle 122 of the fan.

The throttle valve 130 is rotatably mounted to the housing 110 and disposed at the outlet 112. The air current can generate a drive force to drive the throttle valve 130 to rotate thus changing the position of the throttle valve 130 relative to the housing 110. The restoring member 140 provides a restoring force and is connected between the housing 110 and the throttle valve 130 to urge the throttle valve 130 against the drive force generated by the air current, thereby controlling the position of the throttle valve 130 and adjusting the cross-sectional area of the outlet 112 and hence the air volume 60 through the outlet 112. When the drive force of the air current is larger than the restoring force of the restoring member 140, the throttle valve 130 will be rotated in the direction of the air current. When the restoring force of the restoring member 140 is larger than the drive force of the air current, the throttle valve 130 will be rotated in a direction reverse to the direction of the air current. Specifically, in the present embodiment, the throttle valve 130 includes an axle 132 about which the throttle valve 13 rotates. The restoring member 140 is disposed on the axle 132 and provides the restoring force. The restoring member 140 may be a spring such as a torsion spring. When the restoring member 140 is a torsion spring, the restoring force is the torsion force of the torsion spring. The restoring member 140 may include a first end 142 and a second end 144. The first end 142 may be mounted to the throttle valve 130, and the second end 144 may be mounted to the housing 110.

The user may adjust the speed of the fan 120 to change the intensity of the air current. The restoring member 140 can rotate throttle valve 130 to different angles according to the intensity of the air current. The throttle valve 130 can block a portion of the outlet 112 proportional to the rotated angle of the throttle valve 130 to adjust the air volume 60 through the outlet 112. For instance, if the air current intensity decreases with the decrease of the fan speed, the restoring force of the restoring member 140 becomes larger than the drive force generated by the air current against the throttle valve 130 such that the throttle valve 130 is rotated to a position illustrated in FIG. 1B. As such, the proportion of the outlet 112 blocked by the throttle valve 130 to the unblocked portion is increased thus reducing the cross-sectional area of the outlet 112 and hence reducing the air volume 60 through the outlet 112. Although the air volume through the outlet 112 is reduced at this time, the air volume through the outlet 112 is concentrated. On the other hand, if the air current intensity increases with the increase of the fan speed, the drive force of the air current against the throttle valve 130 becomes larger than the restoring force of the restoring member 140 such that the throttle valve 130 is rotated from the position shown in FIG. 1A to a position illustrated in FIG. 1C. As such, the proportion of the outlet 112 blocked by the throttle valve 130 to the unblocked portion is decreased thus increasing the cross-sectional area of the outlet 112 and hence increasing the air volume 60 through the outlet 112.

In the present embodiment, the fan assembly 100 may be used to cool a chip 50 disposed corresponding to the outlet 112 such that the air current generated by the fan 120 flows through the outlet 112 toward the chip 50. When only a small cooling capacity is needed for cooling the chip 50, the fan speed is reduced thus resulting in the decreasing of the air current intensity, and the throttle valve 130 is rotated to the position illustrated in FIG. 1B thus reducing the outlet 112, reducing the air volume 60, and causing the air current to be more concentrated. As such, the fan assembly 100 can be used to cool a specific portion of the chip 50. When a higher cooling capacity is needed for cooling the chip 50, the air current intensity is increased, and the throttle valve 130 is rotated to the position illustrated in FIG. 1C, such that the outlet 112 and the air volume 60 are increased to thereby provide a good capability to cool the whole chip 50. As such, while the user adjusts the speed of the fan 120 to control the air current intensity and the air volume 60 through the outlet 112, the throttle valve 130 can also adjust the air volume 60 through the outlet 112 and expansion/concentration of the air current, which allows the user to more flexibly control the air current to thereby increase the efficiency of the fan 120.

It should be noted that, while the housing is illustrated as having only one outlet in the embodiment described above, this should not be regarded as limiting. Rather, more than one outlet could be disposed in the housing according to needs.

Figure 2A:
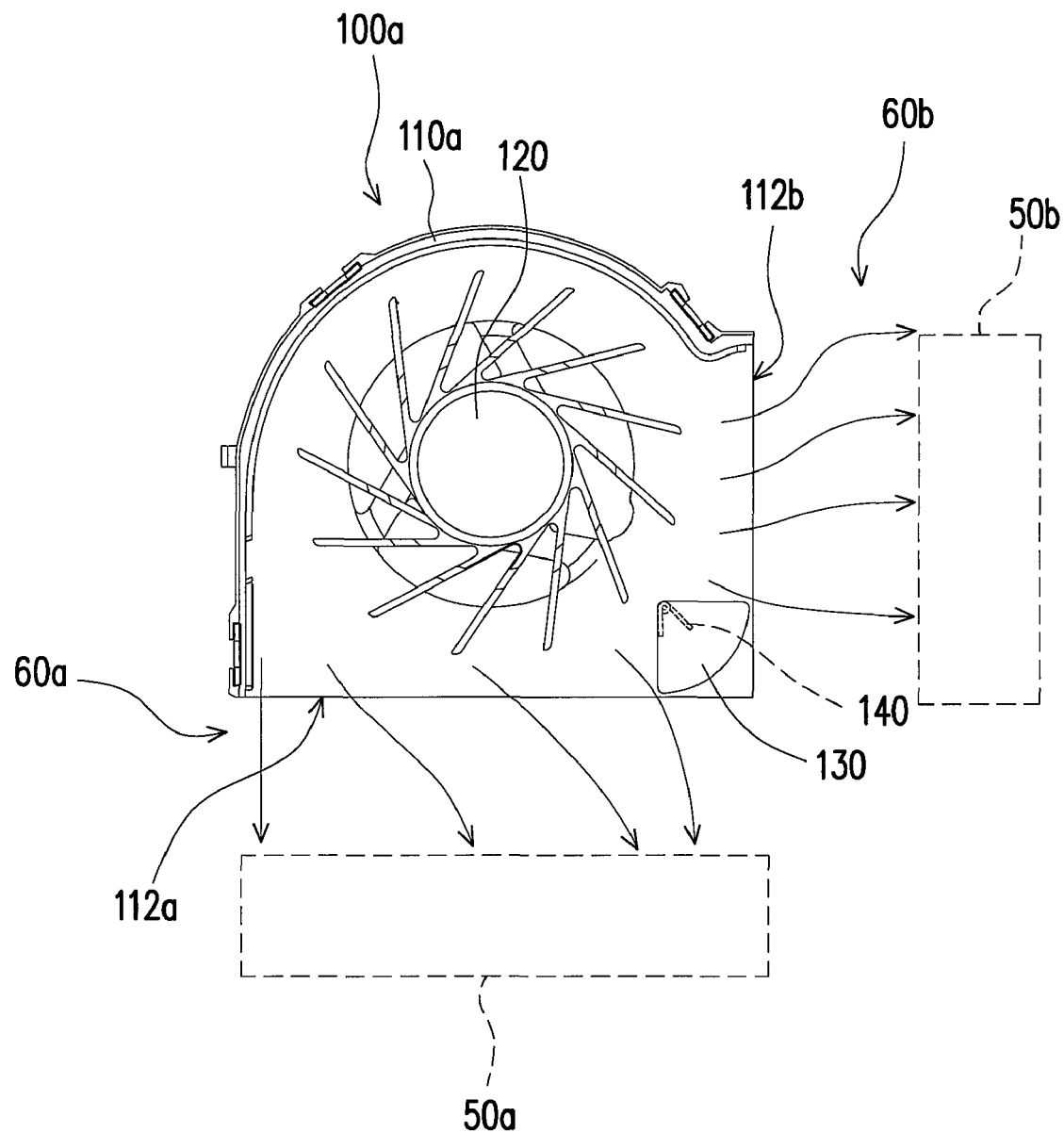
FIGS. 2A to 2C illustrate a fan assembly according to another embodiment of the present invention.
Figure 2B:
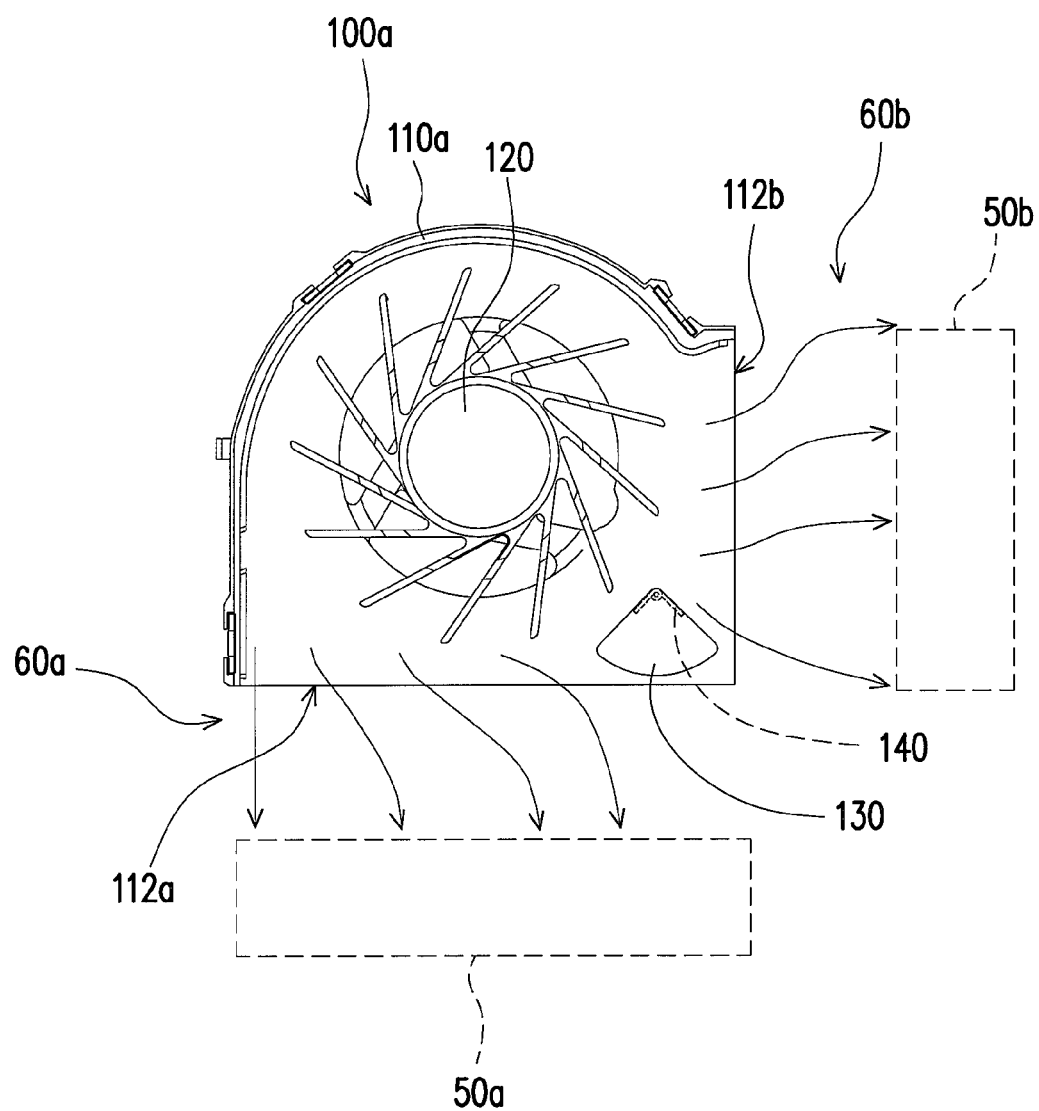
Figure 2C:
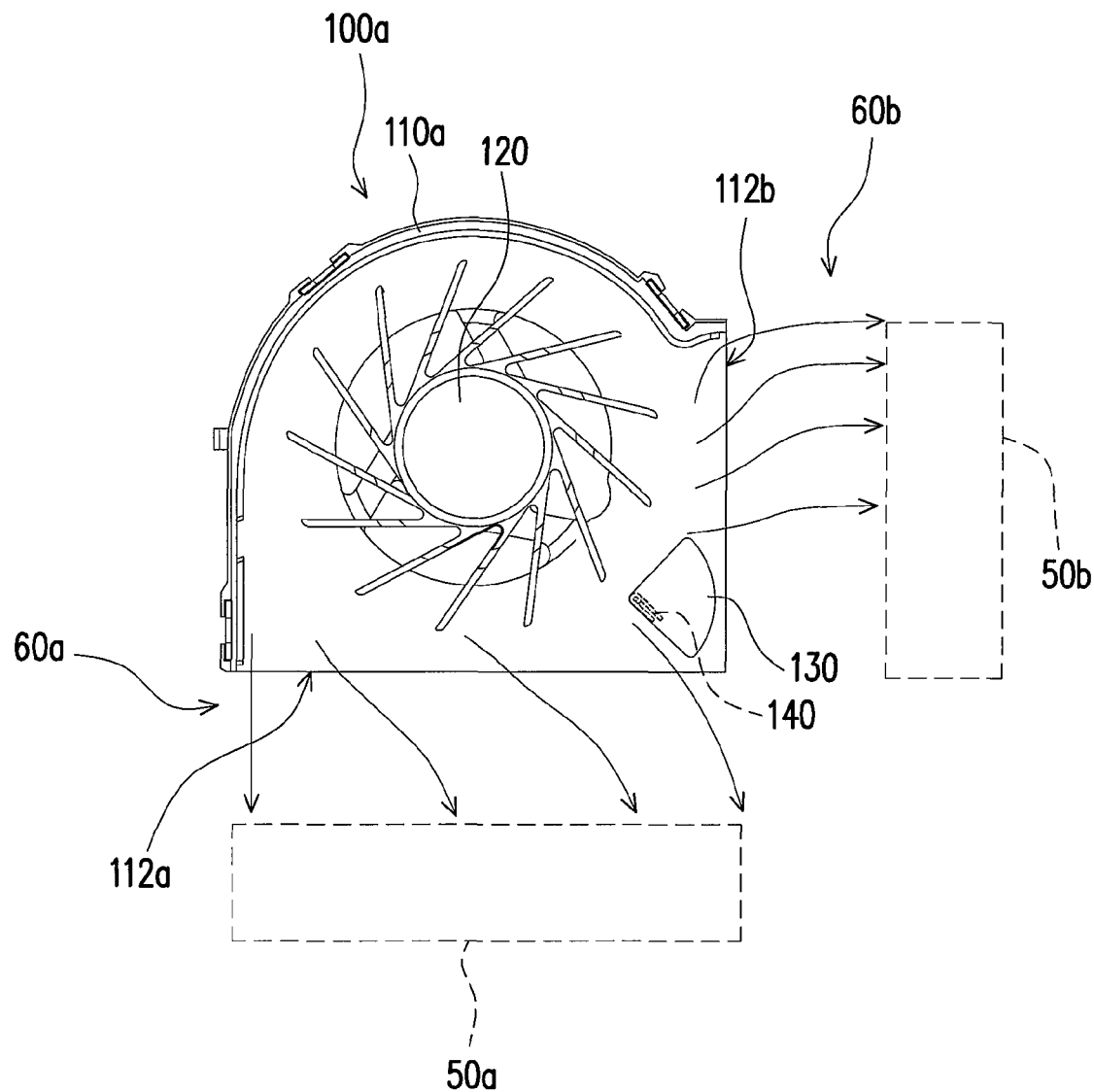

FIGS. 2A to 2C illustrate a fan assembly according to another embodiment of the present invention. Referring to FIGS. 2A to 2C, the present embodiment is similar to the embodiment illustrated in FIGS. 1A to 1C and, in the present embodiment and the embodiment of FIGS. 1A to 1C, like elements will be given like numerals. Only the difference between the two embodiments is described below and those same elements are not repeated.

In the present embodiment, the fan assembly 100a includes a housing 110a having a first outlet 112a and a second outlet 112b. The throttle valve 130 is disposed at a junction of the first outlet 112a and the second outlet 112b. The fan 120 can generate an air current discharged from each of the first outlet 112a and the second outlet 112b. The air current provides a first air volume 60a through the first outlet 112a and a second air volume 60b through the second outlet 112b. The fan assembly 100a of the present embodiment may be used to cool two heat sources. For example, a first chip 50a can be disposed corresponding to the first outlet 112a such that the first chip 50a can be cooled by the first air volume 60a, and a second chip 50b can be disposed corresponding to the second outlet 112b such that the second chip 50b can be cooled by the second air volume 60b.

The throttle valve 130 can be rotated to adjust the proportion between the size of the first outlet 112a and the size of the second outlet 112b. Specifically, when the throttle valve 130 is rotated from the position illustrated in FIG. 2A to the position illustrated in FIG. 2B, the cross-sectional area of the first outlet 112a is reduced and the cross-sectional area of the second outlet 112b is increased thus causing the first air volume 60a to be larger than the second air volume 60b. When the throttle valve 130 is rotated to the position illustrated in FIG. 2C, the cross-sectional area of the first outlet 112a is increased and the cross-sectional area of the second outlet 112b is reduced thus causing the second air volume 60b to be larger than the first air volume 60a.

Figure 3A:
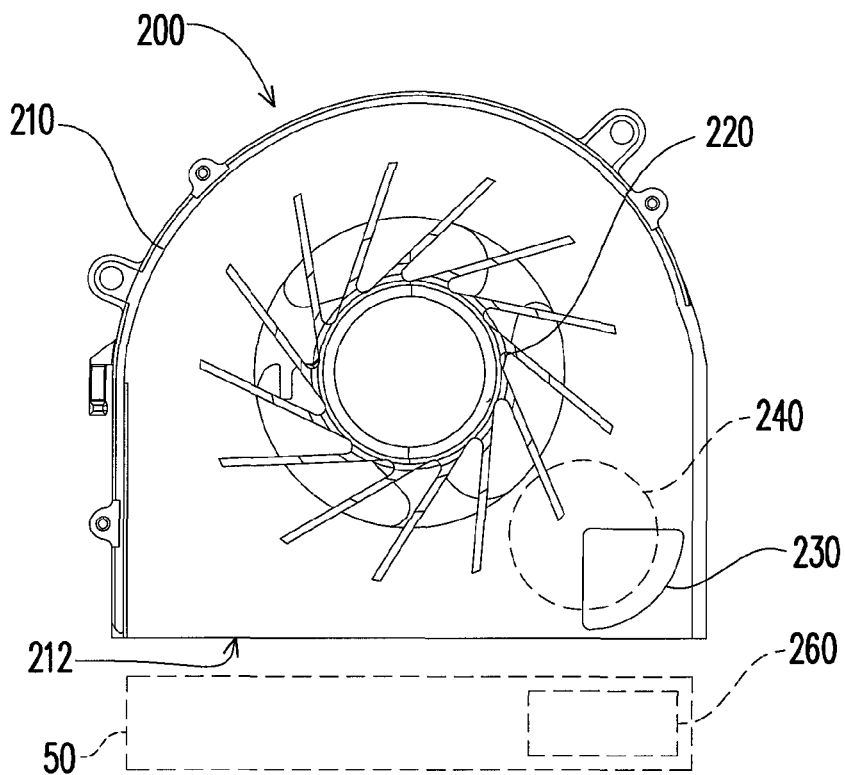
FIGS. 3A to 3C illustrate a fan assembly according to another embodiment of the present invention.
Figure 3B:
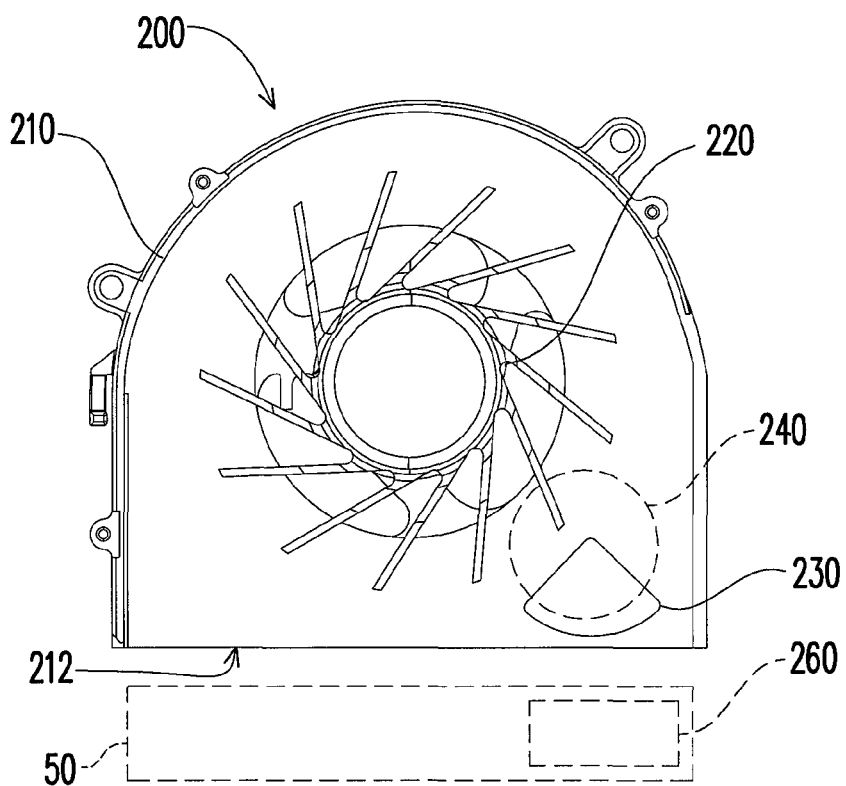
Figure 3C:
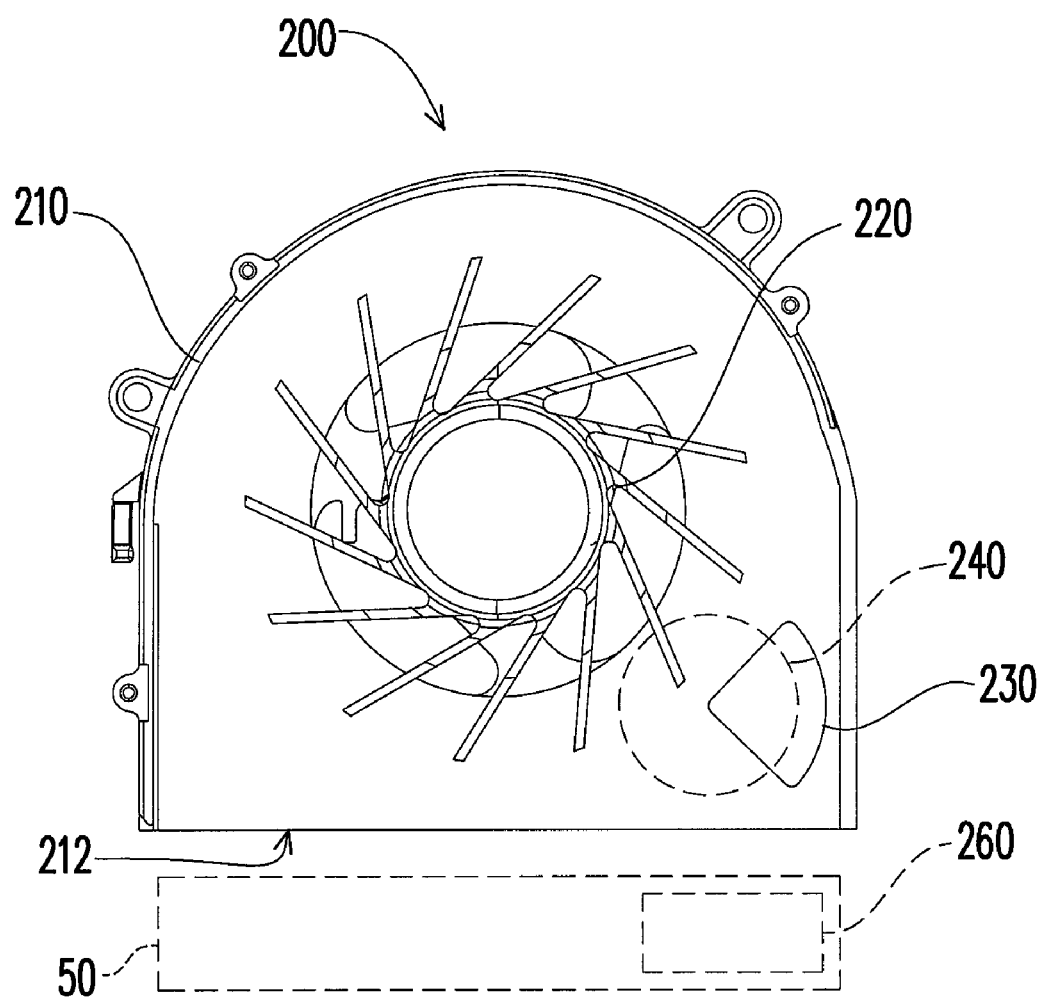

FIGS. 3A to 3C illustrate a fan assembly according to another embodiment of the present invention. It should be understood that, while only a portion of a fan housing is illustrated in the drawings for the sake of clarity, those skilled in the art are capable of practicing the present invention upon reading the disclosure herein. Referring to FIGS. 3A to 3C, the fan assembly 200 includes a housing 210, a fan 220, a throttle valve 230, and an actuator 240. In the present embodiment, the actuator 240 can be considered a component of a regulator. The housing 210 includes an air outlet 212, and the fan 220 is disposed in the housing 210. Specifically, the fan 220 can generates an air current that exits the housing 210 through the outlet 212.

The throttle valve 230, which can be a throat portion of the fan assembly 200, is rotatably mounted to the housing 210 and disposed at the outlet 212. The actuator 240 is connected to the throttle valve 230 to drive the throttle valve 230 to adjust the size of the outlet 212. Specifically, the actuator 240 can include a motor which, when rotating, can drive the throttle valve 230 to rotate therewith. The throttle valve 230 can block a portion of the outlet 212 proportional to the rotated angle of the throttle valve 230 to adjust the air volume through the outlet 220. For instance, if the fan 220 rotates at a fixed speed, the air current generates an air volume through the outlet 212. When the throttle valve 230 is rotated from a position illustrated in FIG. 3A to a position illustrated in FIG. 3B, the proportion of the outlet 212 blocked by the throttle valve 230 to the unblocked portion is increased thus reducing the air volume through the outlet 212. On the other hand, if the throttle valve 230 is rotated to a position illustrated in FIG. 3C, the proportion of the outlet 212 blocked by the throttle valve 230 to the unblocked portion is reduced thus increasing the air volume through the outlet 212.

In the present embodiment, the fan assembly 200 may be used to cool a chip 50 disposed corresponding to the outlet 212 such that the air current generated by the fan 220 flows through the outlet 212 toward the chip 50. When a high cooling capacity is needed for cooling the chip 50, the throttle valve 230 of the fan assembly 200 is rotated from the position illustrated in FIG. 3A to the position illustrated in FIG. 3C, such that the cross-sectional area of the outlet 212 and the air volume 60 through the outlet 212 are increased to thereby provide a good capability to cool the whole chip 50. As such, in addition to controlling the air volume through the outlet 212 by adjusting the speed of the fan 220, the user can also use the throttle valve 230 to adjust the air volume through the outlet 212 without changing the fan speed, which enables the user to more flexibly control the air current thus increasing the efficiency of the fan 220.

Figure 4:
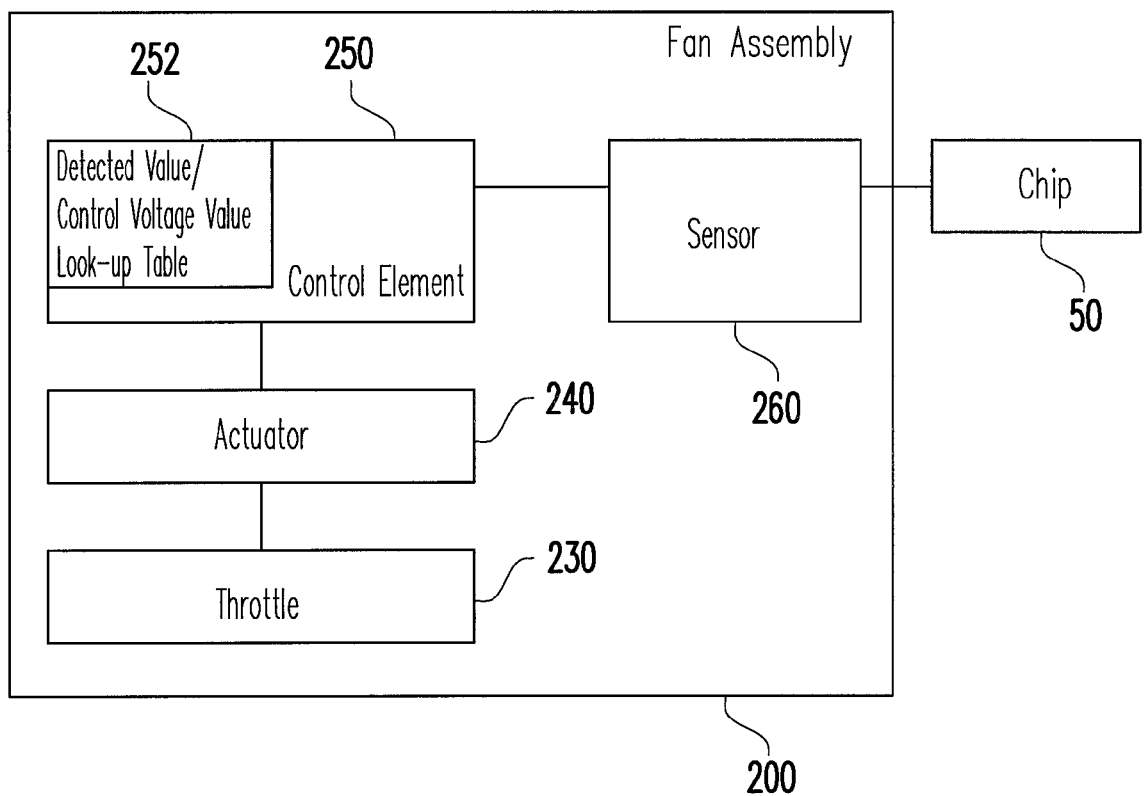
FIG. 4 illustrates a block diagram of the fan assembly of FIGS. 3A to 3C.

FIG. 4 illustrates a block diagram of the fan assembly of FIGS. 3A to 3C. Referring to FIG. 4, the fan assembly 200 may further include a control element 250. The control element 250 is, for example, an electronic controller which may be integrated into another electronic component such as the South Bridge chip of a personal computer. The control element 250 is electrically connected to the actuator 240 to control the rotating of the actuator 240. In addition, the fan assembly 200 may further include a sensor 260. In the present embodiment, the sensor 260 is illustrated as a temperature sensor for purpose of description only and should not be regarded as limiting. The sensor 260 is, for example, disposed on the chip 50 and electrically connected to the control element 250. The sensor 260 can detect the temperature of the chip 50 and transmit the detected value to the control element 250. The control element 250 can control the actuator 240 according to the detected temperature provided by the sensor 260 to adjust the size of the outlet 212. The control element 250 may include a detected value/control voltage value look-up table 252 or a detected value comparison result/control voltage value look-up table stored therein. The control element 250 will look up the detected value or a detected value comparison result provided by the sensor 260 in the detected value/control voltage value look-up table 252 or the detected value comparison result/control voltage value look-up table, and obtain the corresponding control voltage value to control the actuator 240 to rotate the throttle valve 230 to a corresponding angle.

While the sensor 260 is illustrated as a temperature sensor sensing the temperature in the present embodiment, the sensor 260 may be one of a temperature sensor, electrical current sensor, and voltage sensor, or a sensor having a combination of the foregoing functions, which transmits the detected value to the control element 250 to determine whether the fan assembly 200 needs to provide a higher cooling capacity. The voltage sensor or electrical current sensor is used to detect the voltage/current of the fan assembly 200 or the chip 50.

It should be noted that, while the housing is illustrated as having only one outlet in the embodiment described above, this should not be regarded as limiting. Rather, more than one outlet could be disposed in the housing according to needs.

Figure 5A:
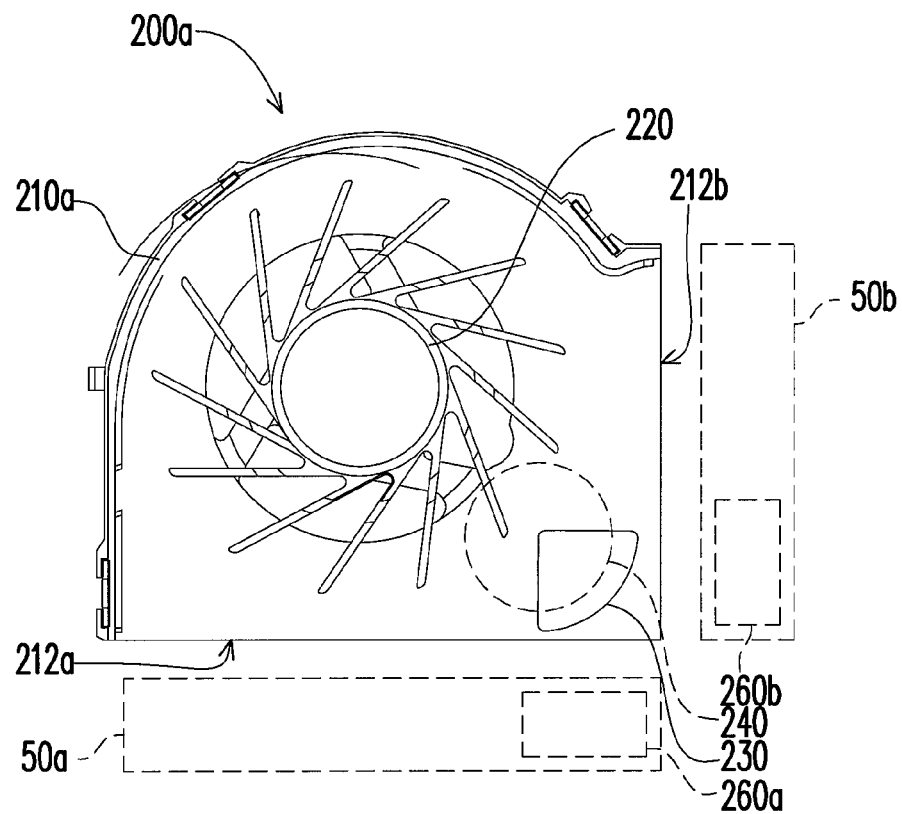
FIGS. 5A to 5C illustrate a fan assembly according to another embodiment of the present invention.
Figure 5B:
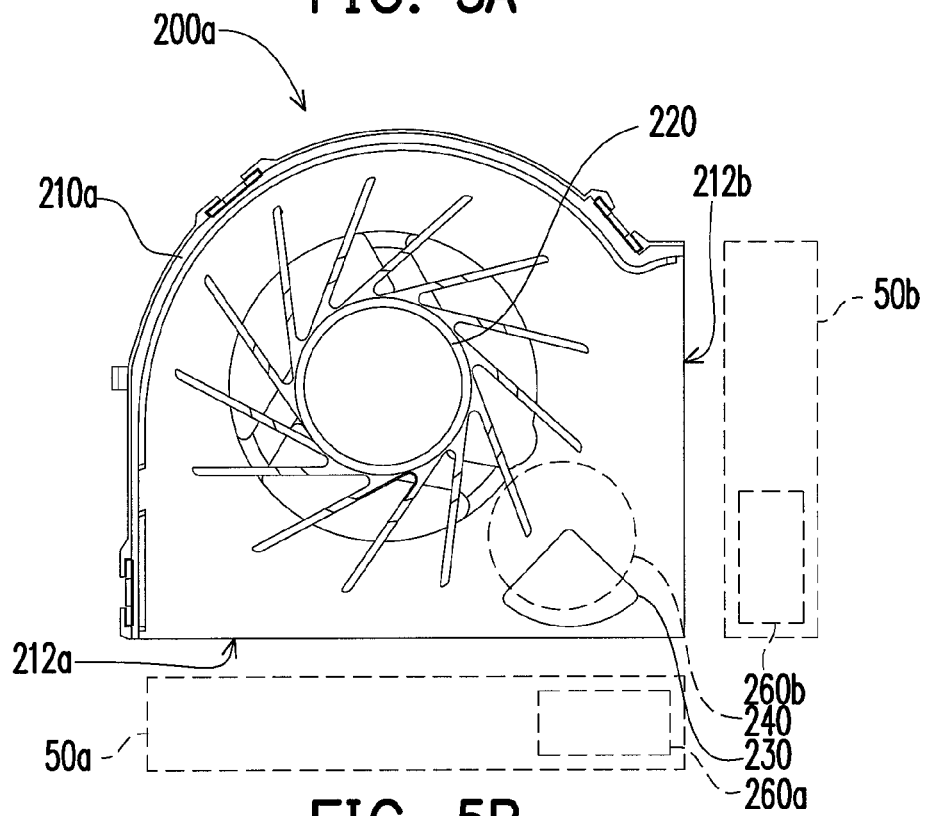
Figure 5C:
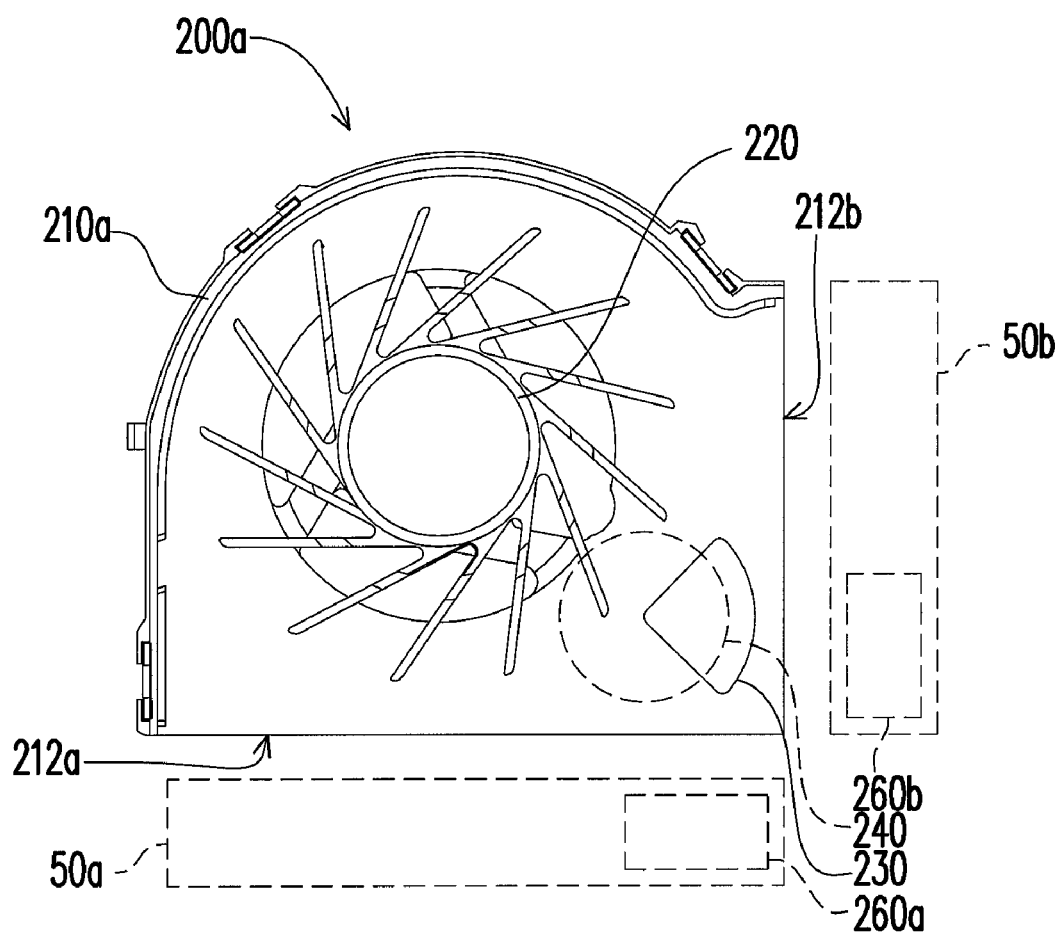

FIGS. 5A to 5C illustrate a fan assembly according to another embodiment of the present invention. Referring to FIGS. 5A to 5C, the present embodiment is similar to the embodiment illustrated in FIGS. 3A to 3C and, in the present embodiment and the embodiment of FIGS. 3A to 3C, like elements will be given like numerals. Only the difference between the two embodiments is described below and those same elements are not repeated.

In the present embodiment, the fan assembly 200a includes a housing 210a having a first outlet 212a and a second outlet 212b. The throttle valve 230 is disposed at a junction of the first outlet 212a and the second outlet 212b. The fan assembly 200a of the present embodiment may be used to cool two heat sources. For example, a first chip 50a can be disposed corresponding to the first outlet 212a, and a second chip 50b can be disposed corresponding to the second outlet 112b.

Similar to those described above, the throttle valve 230 can be rotated to adjust the proportion between the size of the first outlet 212a and the size of the second outlet 212b. Specifically, the air current generates a first air volume through the first outlet 212a and a second air volume through the second outlet 212b. When the first chip 50a needs a lower cooling capacity than that needed by the second chip 50b, the throttle valve 230 is rotated from the position illustrated in FIG. 5A to the position illustrated in FIG. 5B. As such, by changing the cross-sectional area of the first outlet 212a and the second outlet 212b, a smaller air volume through the first outlet 212a and a larger air volume through the second outlet 212b can be achieved to meet the respective cooling requirements of the first chip 50a and the second chip 50b without changing the fan speed. When the first chip 50a needs a higher cooling capacity than that needed by the second chip 50b, the throttle valve 230 is rotated to the position illustrated in FIG. 5C. As such, by changing the cross-sectional area of the first outlet 212a and the second outlet 212b, a larger air volume through the first outlet 212a and a smaller air volume through the second outlet 212b can be achieved to meet the respective cooling requirements of the first chip 50a and the second chip 50b without changing the fan speed.

Figure 6:
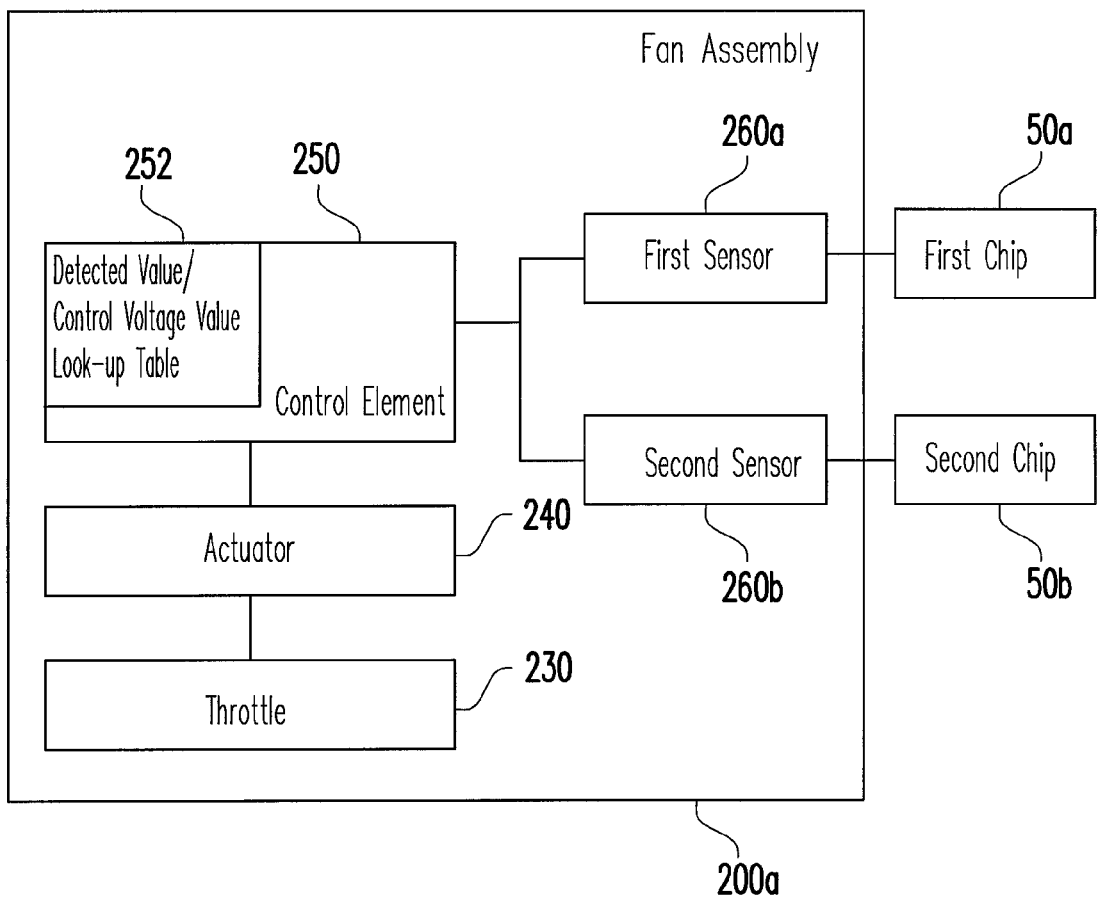
FIG. 6 illustrates a block diagram of the fan assembly of FIGS. 5A to 5C.

FIG. 6 illustrates a block diagram of the fan assembly of FIGS. 5A to 5C. Referring to FIG. 6, the fan assembly 200a may also include a sensor. For example, the fan assembly 200a may further include a first sensor 260a and a second sensor 260b. The first sensor 260a is disposed on the first chip 50a, the second sensor 260b is disposed on the second chip 50b, and the first sensor 260a and second sensor 260b are electrically connected to the control element 250. The first sensor 260a and the second sensor 260b can detect the temperature of the first chip 50a and the second chip 50b, respectively, and transmit the detected values to the control element 250. The control element 250 can determine the cooling capacity needed by the first chip 50a and the second chip 50b by referring to and comparing the detected values provided by the first and second sensors 260a, 260b, and determine the size of the first outlet 212a and the size of the second outlet 212b by controlling the actuator 240 via the use of the detected value comparison result/control voltage value look-up table 252.

The first sensor 260a and the second sensor 260b can be constructed and operated in the similar way as described in relation to the sensor 260 and therefore their construction and operation are not repeated herein.

Figure 7:
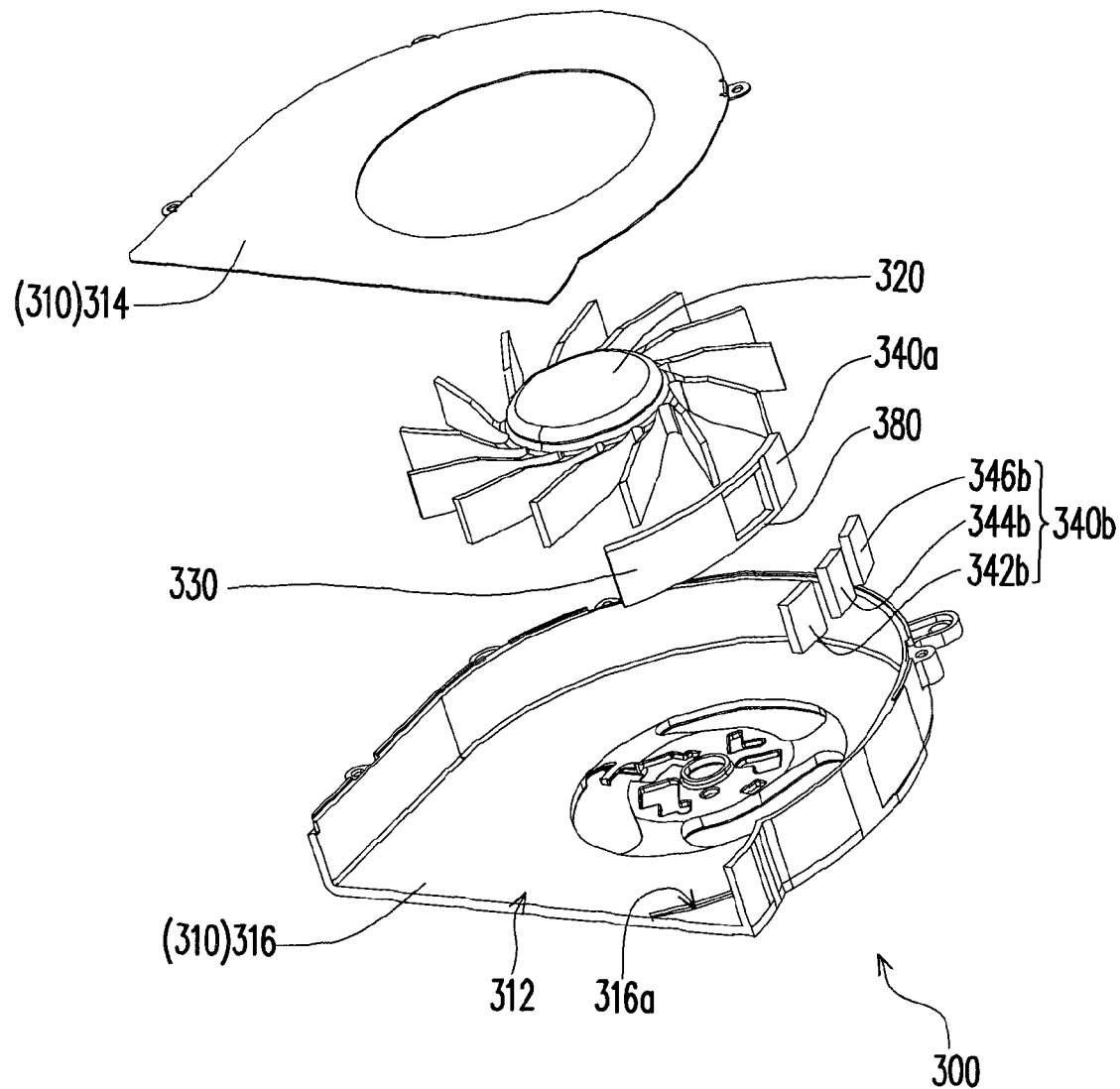
FIG. 7 is an exploded view of a fan assembly according to one embodiment of the present invention.
Figure 8A:
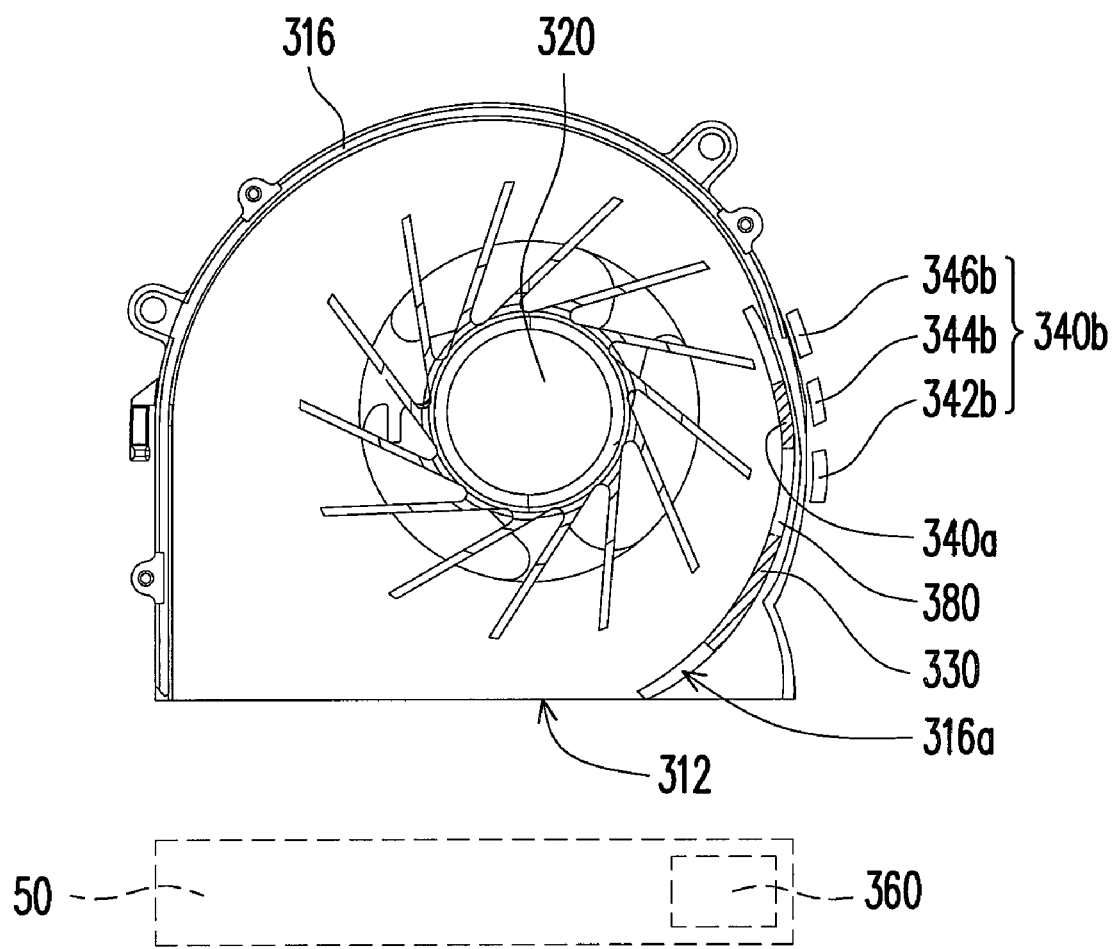
FIGS. 8A to 8C illustrate the fan assembly of FIG. 7.
Figure 8B:
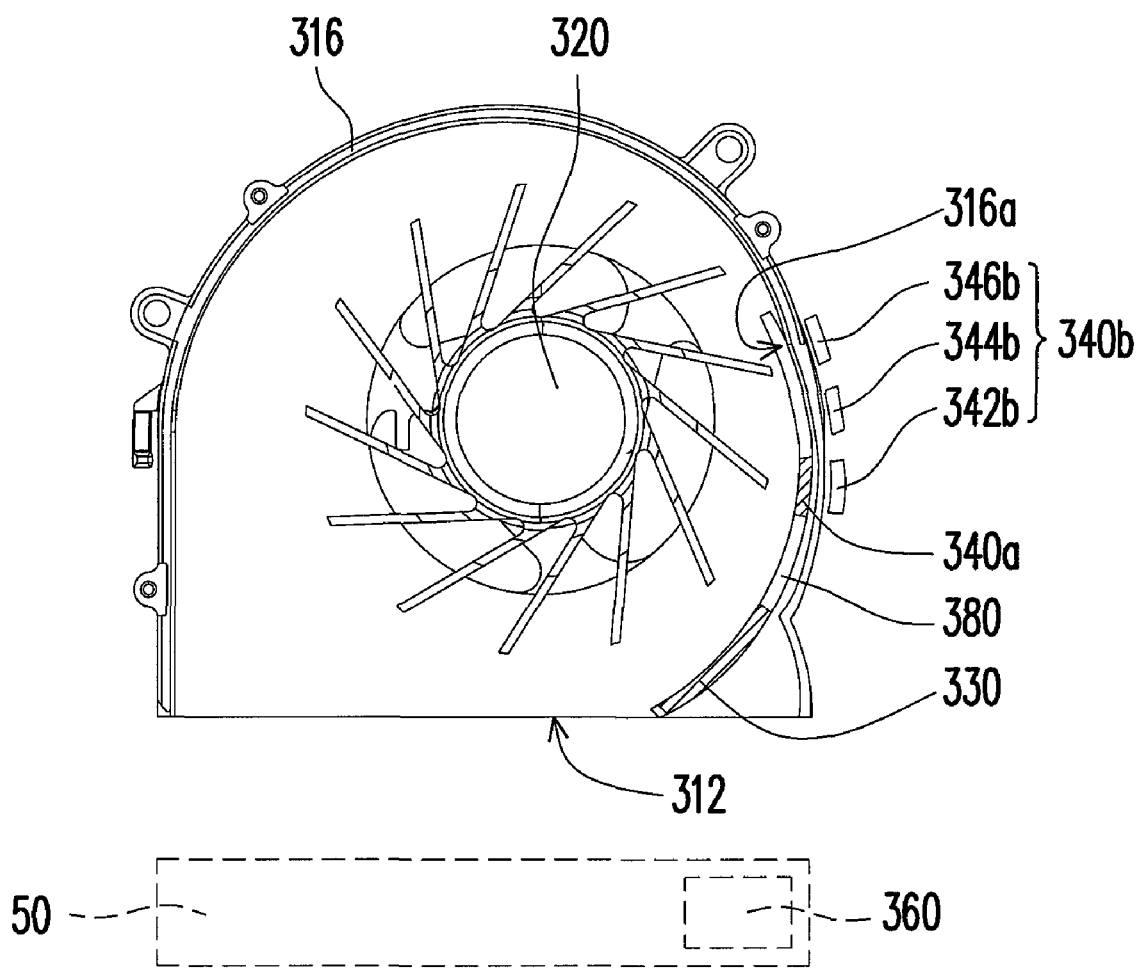
Figure 8C:
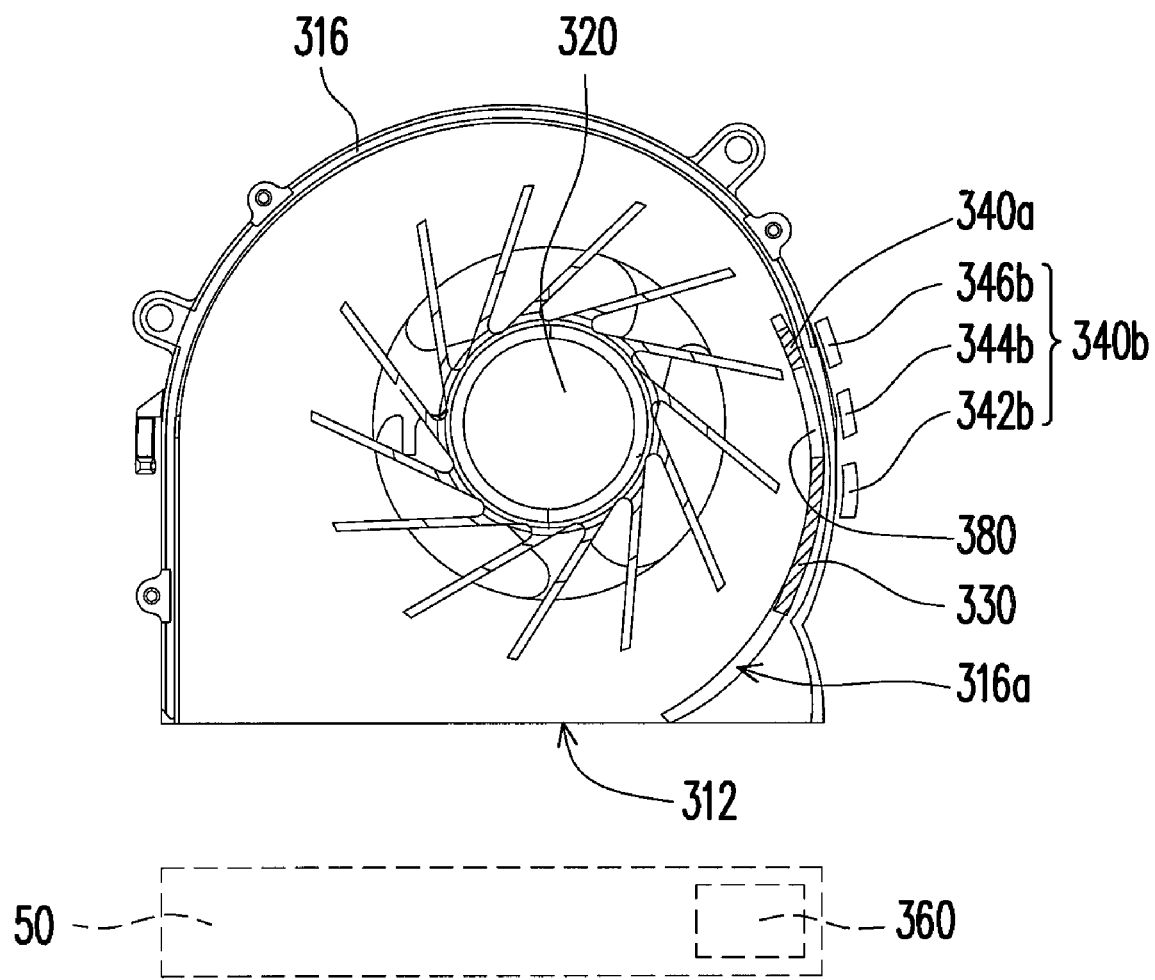

FIG. 7 is an exploded view of a fan assembly according to one embodiment of the present invention. FIGS. 8A to 8C illustrate the fan assembly of FIG. 7. It is noted that only a lower cover of the housing is shown in FIGS. 8A to 8C for the sake of clarity. Referring to FIG. 7 and FIG. 8A, the fan assembly 300 includes a housing 310, a fan 320, a throttle valve 330, a first magnetic element 340a, and a second magnetic element 340b. In the present embodiment, the first magnetic element 340a and the second magnetic element 340b are considered components of a regulator. The housing 310 includes an upper cover 314 and a lower cover 316 that form a receiving space therebetween for receiving the fan 320 therein. The housing 310 includes an outlet 312, and the fan 320 is disposed in the housing 310. The fan 320 can generate an air current that exits the housing 310 through the outlet 312.

The throttle valve 330 is rotatably mounted to the housing 310 and disposed at the outlet 312. The first magnetic element 340a is connected to the throttle valve 330, and the second magnetic element 340b is disposed on the housing 300. The second magnetic element 340b is used to control the position of the first magnetic element 340 by using the magnetic force produced therebetween, thus controlling movement of the throttle valve 330 and hence adjusting the size of the outlet 312.

Specifically, the material of the first magnetic element 340a may be ferromagnetic metal or ferrite magnetic material such as bulk iron. The second magnetic element 340b may include an electromagnet. The second magnetic element 340b may include a single electromagnet or a plurality of electromagnets according to different requirements of the product design. When the second magnetic element 340b is a single electromagnet, the position of the first magnetic element can be adjusted by changing the magnetic polarity of the electromagnet. When the polarity of the second magnetic element 340b is the same as the polarity of the first magnetic element 340a, a repulsive force is generated between the second magnetic element 340b and the first magnetic element 340a to rotate the throttle valve; when the polarity of the second magnetic element 340b is different from the polarity of the first magnetic element 340a, an attractive force is generated between the second magnetic element 340b and the first magnetic element 340a to rotate the throttle valve. In both situations described herein, the size of the outlet 312 can be adjusted.

In the present embodiment, the second magnetic element 340b is illustrated as having a first electromagnet 342b, a second electromagnet 344b, and a third electromagnet 346b for purpose of description only and should not be regarded as limiting. When an electrical current is controlled to flow through the first electromagnet 342b to generate an attractive force, the first magnetic element 340a is moved toward the first electromagnet 342b. Similarly, the method could also be used to cause the first magnetic element 340a to move toward the second electromagnet 344b or the third electromagnet 346b. It should be noted that, while the second magnetic element 340b consists of the first electromagnet 342b, second electromagnet 344b and third electromagnet 346b, the present invention should not be limited to the embodiment described herein. Rather, the present invention could employ a different number of electromagnets according to needs, for example, employ only a first electromagnet 342b and a second electromagnet 344b.

In addition, the fan assembly 300 may further include a connecting member 380 connected between the first magnetic element 340a and the throttle valve 330. The lower cover 316 of the housing 310 may include a track 316a on which the connecting member 380, the first magnetic element 340a and the throttle valve 330 are disposed. As such, the first magnetic element 340a may drive the throttle valve 330 to move along the track 316a.

Referring to FIGS. 8A to 8C, when disposed at different positions, the throttle valve 330 can block a different portion of the outlet 312 to thereby adjust the air volume. For example, when the fan 320 rotates at a fixed speed, the air current generates an air volume through the outlet 312. When the first magnetic element 340a is moved to the first electromagnet 342b and the throttle valve 330 is moved from the position illustrated in FIG. 8A to the position illustrated in FIG. 8B, the portion of the outlet 312 that is being blocked by the throttle valve 330 is increased. Therefore, the air volume through the outlet 312 is reduced without changing the speed of the fan 320. However, when the throttle valve 330 is moved to the position illustrated in FIG. 8C, the portion of the outlet 312 that is being blocked by the throttle valve 330 is decreased and, therefore, the air volume through the outlet 312 is increased without changing the speed of the fan 320.

In the present embodiment, the fan assembly 300 may be used to cool a chip 50 disposed corresponding to the outlet 312 such that the air current generated by the fan 320 flows through the outlet 312 toward the chip 50. When only a small cooling capacity is needed for cooling the chip 50, the throttle valve 330 is moved to the position illustrated in FIG. 8B to reduce the outlet 312. In this case, the fan assembly 300 can be used to cool a specific portion of the chip 50 without changing the fan speed. When a higher cooling capacity is needed for cooling the chip 50, the throttle valve 330 is moved to the position illustrated in FIG. 8C to enlarge the outlet 312. In this case, the air volume through the outlet 312 is increased to provide a good capability to cool the chip 50 without changing the fan speed. As such, in addition to controlling the air volume through the outlet 312 by adjusting the speed of the fan 320, the user can also use the throttle valve 330 to adjust the air volume through the outlet 312 without changing the fan speed, which enables the user to more flexibly control the air current thus increasing the efficiency of the fan 120.

Figure 9:
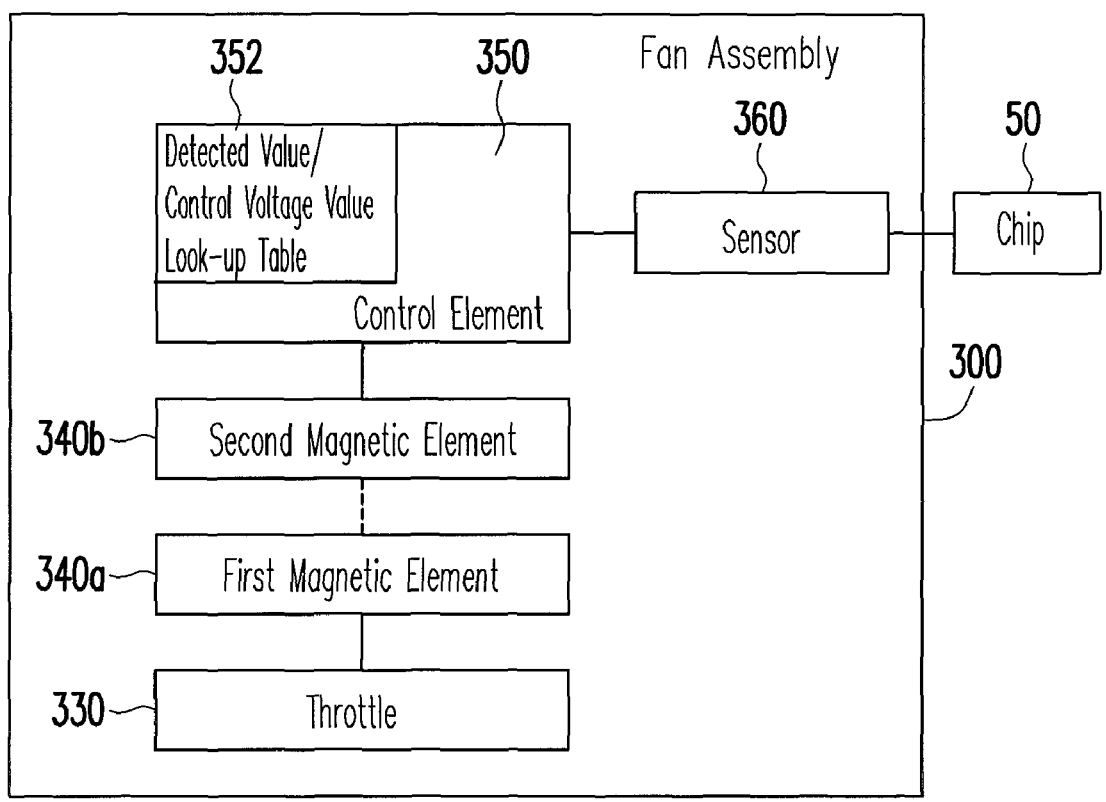
FIG. 9 illustrates a block diagram of the fan assembly of FIG. 7.

FIG. 9 illustrates a block diagram of the fan assembly of FIG. 7. Referring to FIG. 9, the fan assembly 300 may further include a control element 350. The control element 350 is, for example, an electronic controller which may be integrated into another electronic component such as the South Bridge chip of a personal computer. The control element 350 is electrically connected to the second magnetic element 340b to control the second magnetic element 340b to move the first magnetic element 340a and hence the throttle valve 330. In addition, the fan assembly 300 may further include a sensor 360. The sensor 360 is, for example, disposed on the chip 50 and electrically connected to the control element 350. The sensor 360 can detect the temperature of the chip 50 and transmit the detected value to the control element 350. The control 350 can control the second magnetic element 340b according to the detected value provided by the sensor 360 to determine the size of the outlet 312. Similar to those described above, the control element 350 may include a detected value/control voltage value look-up table 352 or a detected value comparison result/control voltage value look-up table stored in the control element 350. The control element 350 will look up the detected value or a detected value comparison result provided by the sensor 360 in the detected value/control voltage value look-up table 352 or the detected value comparison result/control voltage value look-up table and obtain the corresponding control voltage value to control the second magnetic element 340b to drive the throttle valve 330 to a corresponding position.

While the sensor 360 is illustrated as a temperature sensor sensing the temperature in the present embodiment, the sensor 360 may be one of a temperature sensor, electrical current sensor, and voltage sensor, or a sensor having a combination of the foregoing functions, which transmits the detected value to the control element 350 to determine whether the fan assembly 300 needs to provide a higher cooling capacity. The voltage sensor or electrical current sensor is used to detect the voltage/current of the fan assembly 300 or the chip 50.

Figure 10:
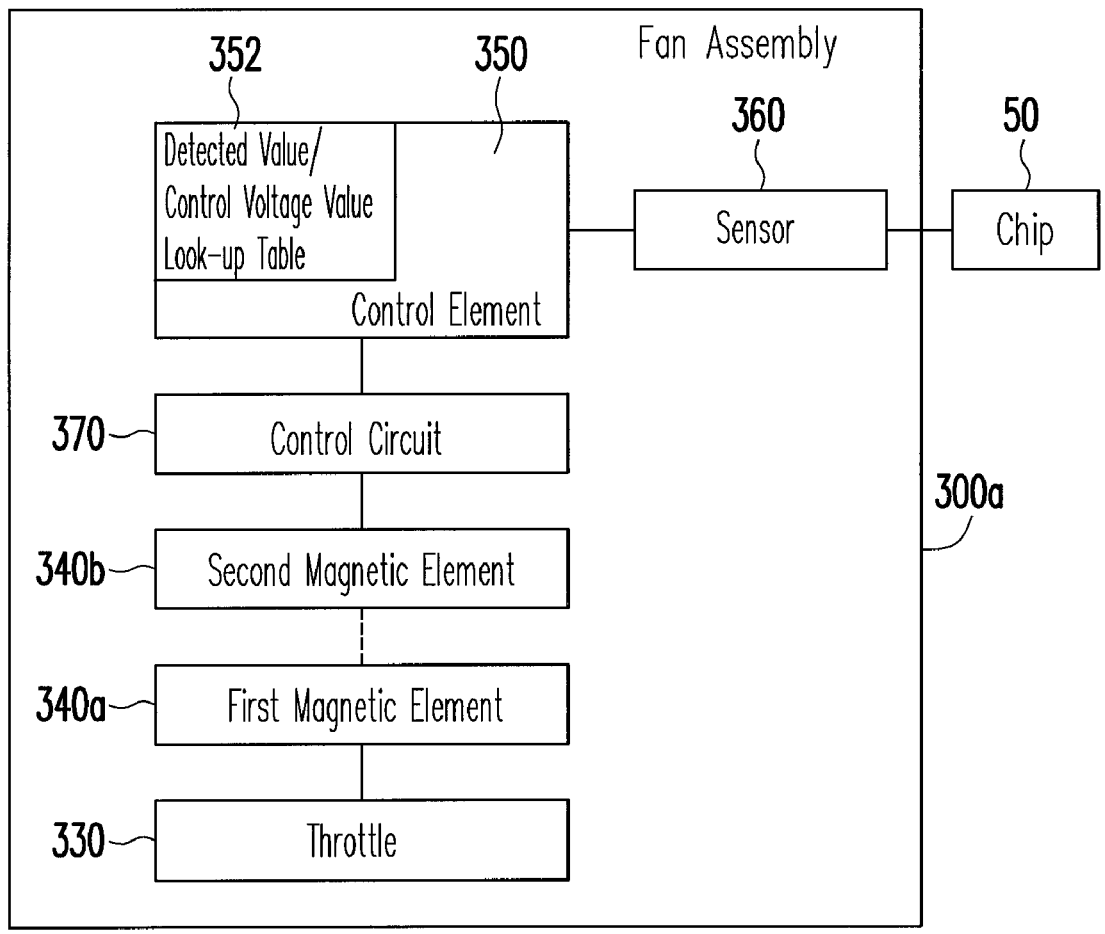
FIG. 10 illustrates a block diagram of a fan assembly according to another embodiment of the present invention.

FIG. 10 is a block diagram of a fan assembly according to another embodiment of the present invention. Referring to FIG. 10, when compared with the fan assembly 300, the fan assembly 300a further include a control circuit 370 electrically connected between the control element 350 and the second magnetic element 340b. The control circuit 370 can receive a signal from the control element 350 and supply an external power to control the second magnetic element 340b.

It should be noted that, while the housing is illustrated as having only one outlet in the embodiment described above, this should not be regarded as limiting. Rather, more than one outlet could be disposed in the housing according to needs.

Figure 11:
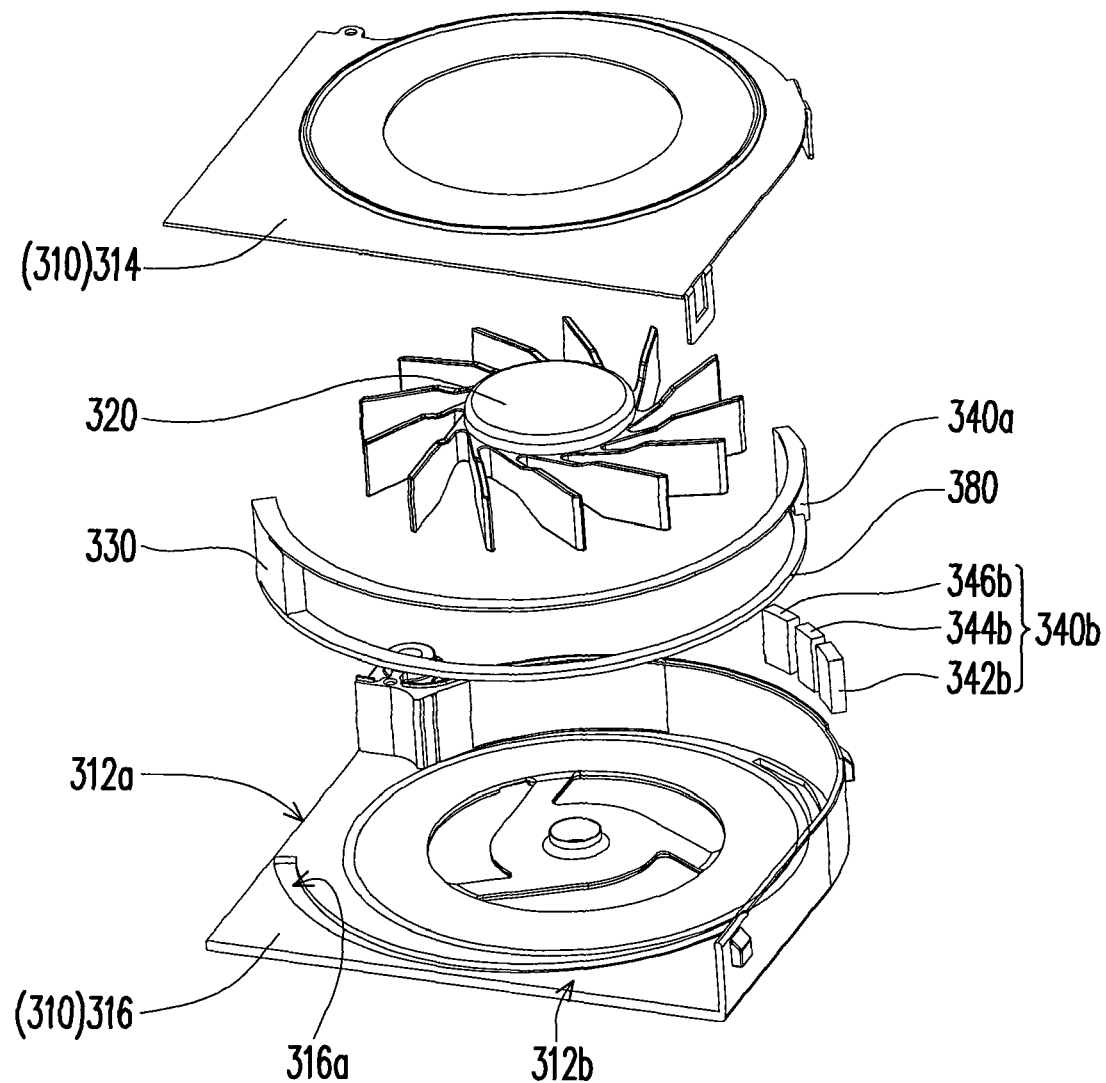
FIG. 11 is an exploded view of a fan assembly according to still another embodiment of the present invention.
Figure 12A:
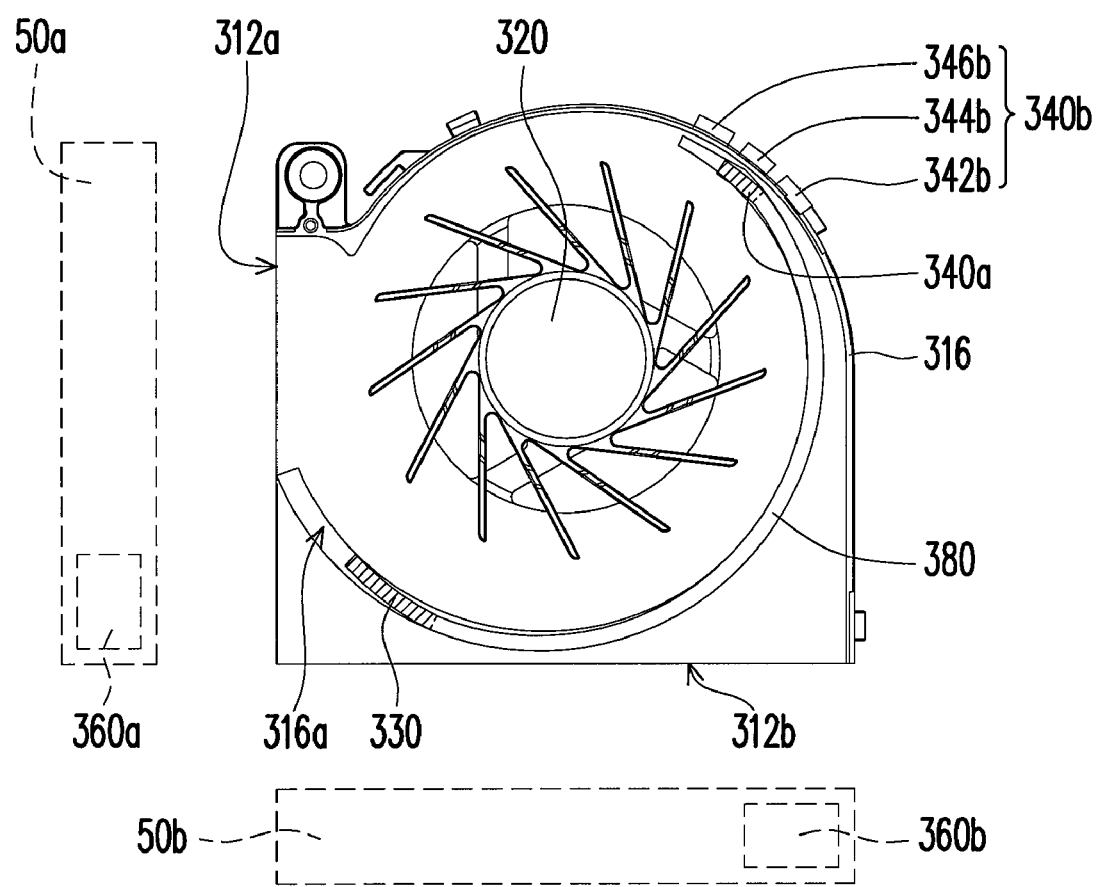
FIGS. 12A to 12C illustrate the fan assembly of FIG. 11.
Figure 12B:
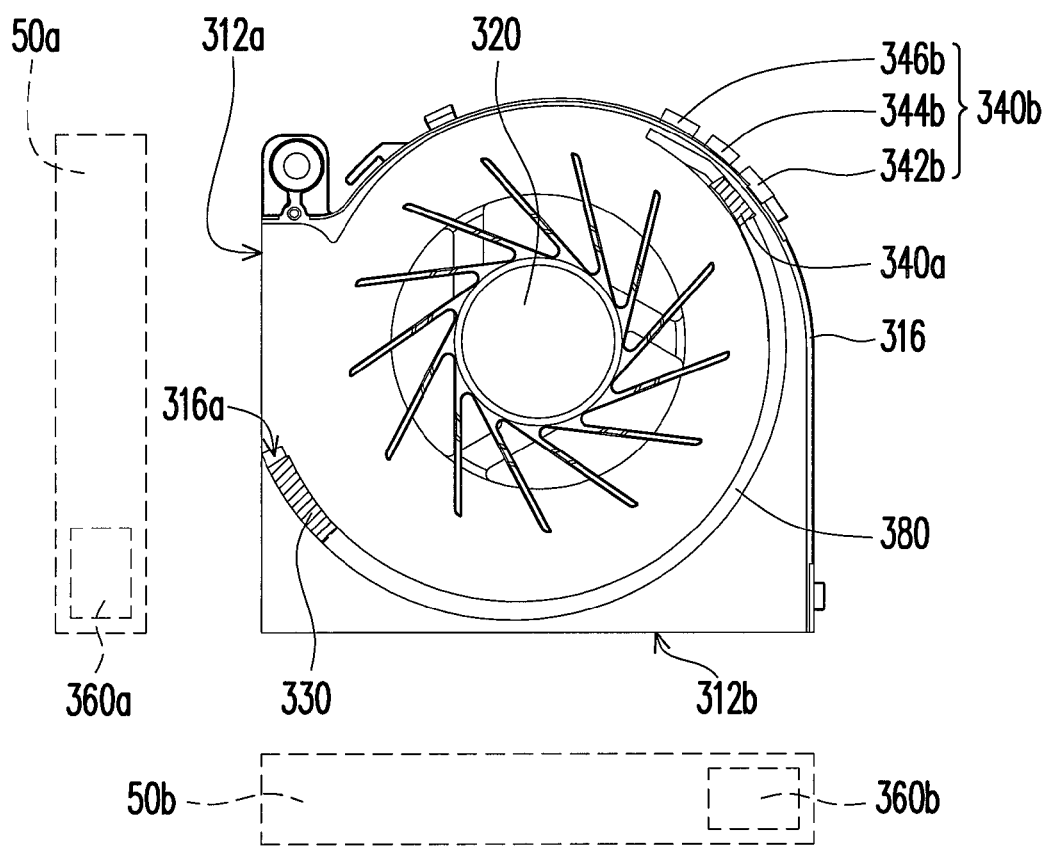
Figure 12C:
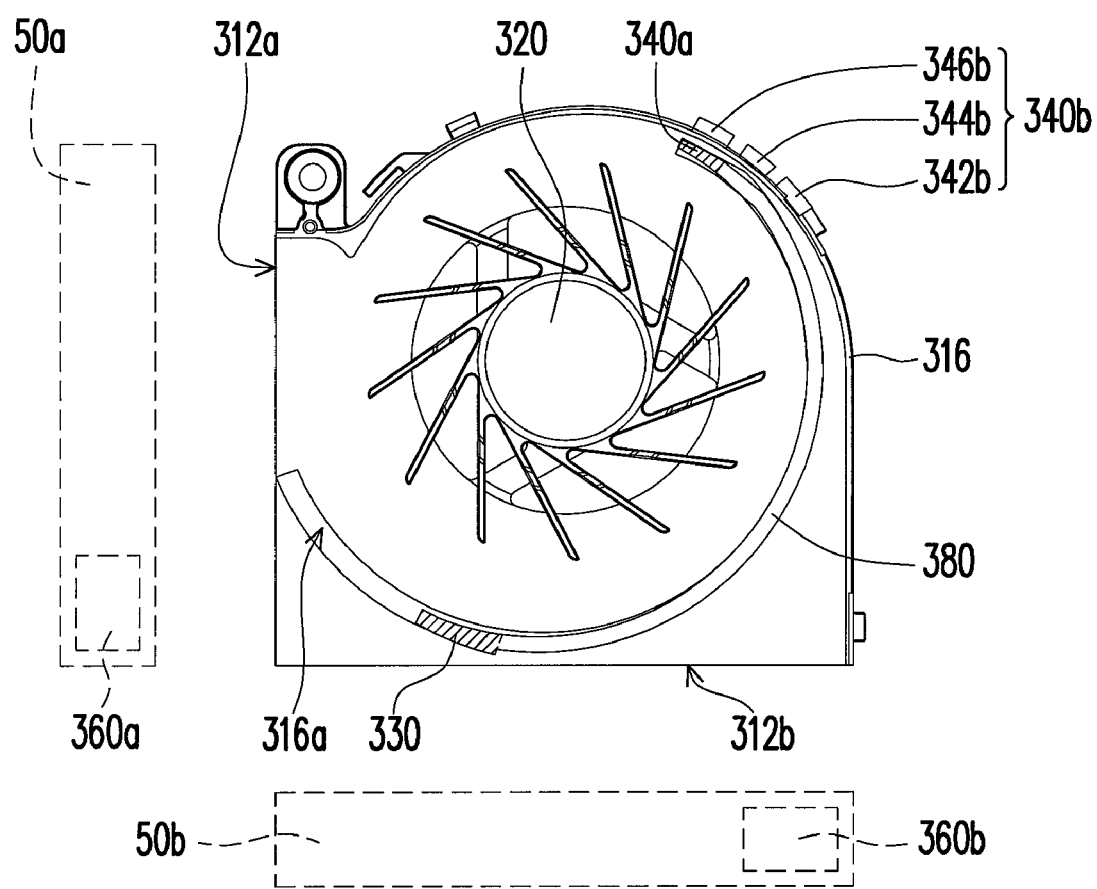

FIG. 11 is an exploded view of a fan assembly according to still another embodiment of the present invention. FIGS. 12A to 12C illustrate the fan assembly of the FIG. 11. Referring to FIG. 11 and FIGS. 12A to 12C, the present embodiment is similar to the embodiment of FIGS. 8A to 8C and, in the present embodiment and the embodiment of FIGS. 8A to 8C, like elements will be given like numerals. Only the difference between the two embodiments is described below and those same elements are not repeated.

In the present embodiment, the housing 310b of the fan assembly 300b includes a first outlet 312a and a second outlet 312b. The throttle valve 330 is disposed at a junction of the first outlet 312a and the second outlet 312b. The fan assembly 300a of the present embodiment may be used to cool two heat sources. For example, a first chip 50a can be disposed corresponding to the first outlet 212a, and a second chip 50b can be disposed corresponding to the second outlet 112b.

Similar to those described above, the throttle valve 330 can be rotated to adjust the proportion between the size of the first outlet 312a and the size of the second outlet 312b. Specifically, the air current generates a first air volume through the first outlet 312a and a second air volume through the second outlet 312b. When the first chip 50a needs a lower cooling capacity than that needed by the second chip 50b, the throttle valve 330 is rotated from the position illustrated in FIG. 12A to the position illustrated in FIG. 12B. As such, by changing the cross-sectional area of the first outlet 312a and the second outlet 312b, a smaller air volume through the first outlet 312a and a larger air volume through the second outlet 312b can be achieved such that the second chip 50b can be cooled with a higher cooling capacity without changing the fan speed. When the first chip 50a needs a higher cooling capacity than that needed by the second chip 50b, the throttle valve 330 is rotated to the position illustrated in FIG. 12C. As such, by changing the cross-sectional area of the first outlet 312a and the second outlet 312b, a larger air volume through the first outlet 312a and a smaller air volume through the second outlet 312b can be achieved such that the first chip 50a can be cooled with a higher cooling capacity without changing the fan speed.

Figure 13:
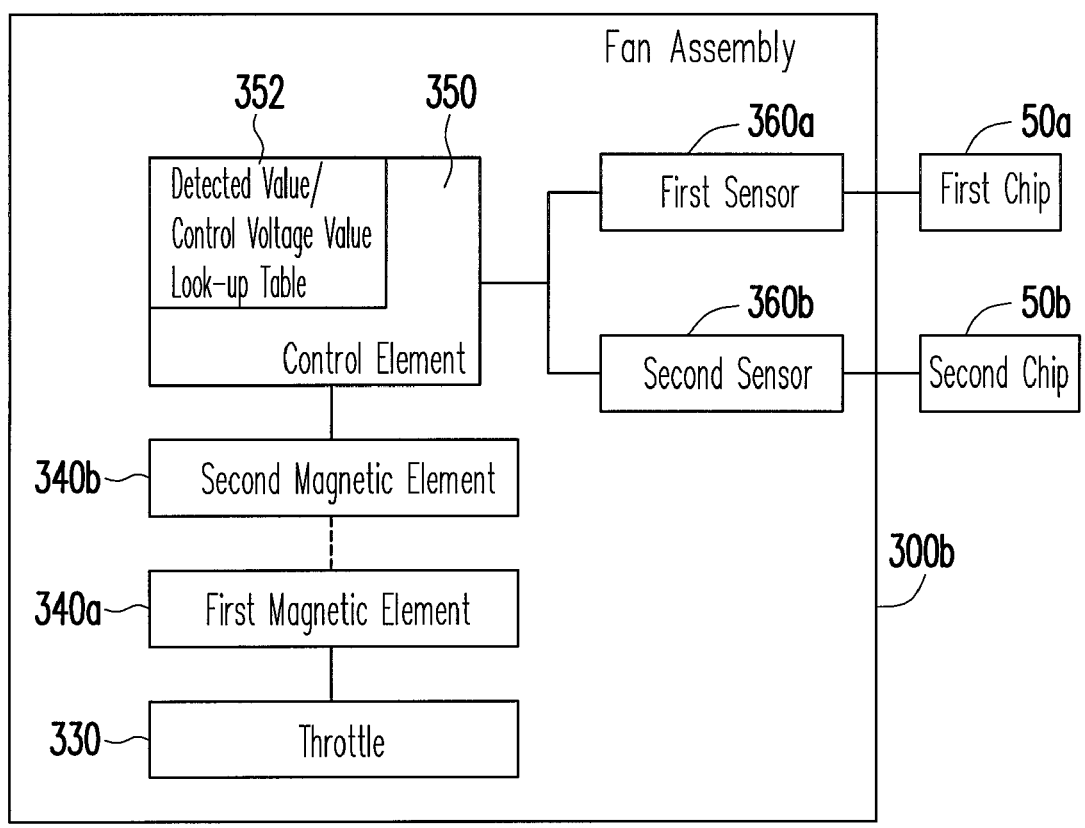
FIG. 13 illustrates the fan assembly of FIGS. 12A to 12C.

FIG. 13 illustrates a block diagram of the fan assembly of FIGS. 12A to 12C. Referring to FIG. 13, the fan assembly 300a may also include a sensor. For example, the fan assembly 300a may further include a first sensor 360a and a second sensor 360b. The first sensor 360a is disposed, for example, on the first chip 50a, the second sensor 360b is disposed, for example, on the second chip 50b, and the first sensor 360a and second sensor 360b are electrically connected to the control element 350. The first sensor 360a and the second sensor 360b can detect the temperature of the first chip 50a and the second chip 50b, respectively, and transmit the detected values to the control element 350. The control element 350 can determine the cooling capacity needed by the first chip 50a and the second chip 50b by referring to and comparing the detected values provided by the first and second sensors 360a, 360b, and determine the size of the first outlet 312a and the size of the second outlet 312b by controlling the second magnetic element 340b via the use of the detected value comparison result/control voltage value look-up table 352. Besides, the fan assembly 300b may likewise include a control circuit (not shown) similar to the control circuit of the fan assembly 300 as shown in FIG. 10. In addition, the first sensor 360a and the second sensor 360b can be constructed and operated in the similar way as described in relation to the sensor 360 and therefore their construction and operation are not repeated herein.

Figure 14A:
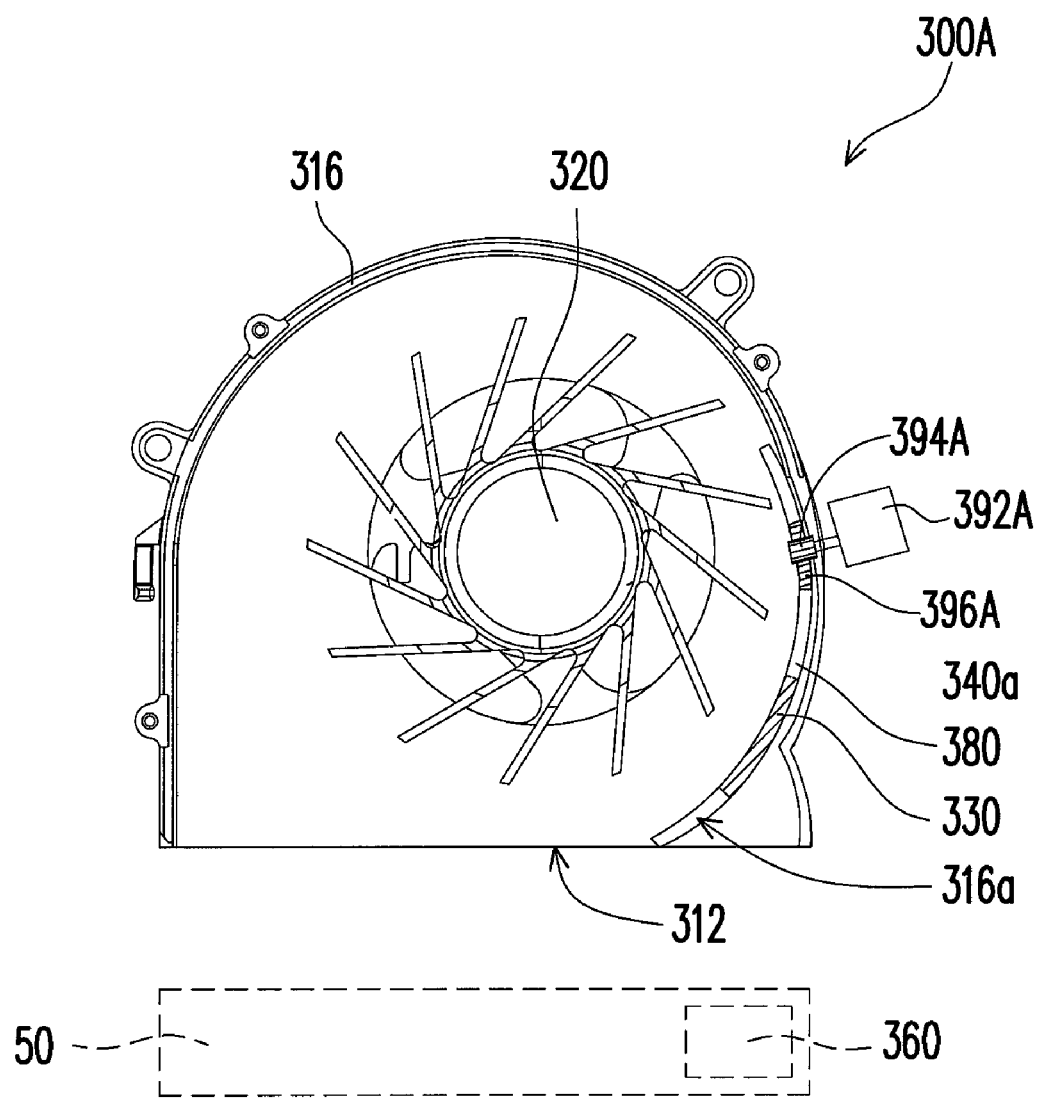
FIG. 14A illustrates a fan assembly according to another embodiment of the present invention.

FIG. 14A illustrates a fan assembly according to another embodiment of the present invention. Referring to FIG. 14A, the present embodiment is in part similar to the embodiment of FIG. 8A, and in these two embodiments, like elements will be given like numerals. Only the difference between the two embodiments is described below and those same elements are not repeated herein. In the present embodiment, the fan assembly 300A includes a motor 392A, a gear 394A, and a rack 396A. The motor 392A, gear 394A and rack 396A are considered components of a regulator. The gear 394A is connected to the motor 392A and adapted to be driven by the motor 392A to rotate. The rack 396A is mounted to the throttle valve 330 and meshes with the gear 394A to control the movement of the throttle valve 330 to thereby adjust the size of the first outlet 312 and hence the first air volume.

Figure 14B:
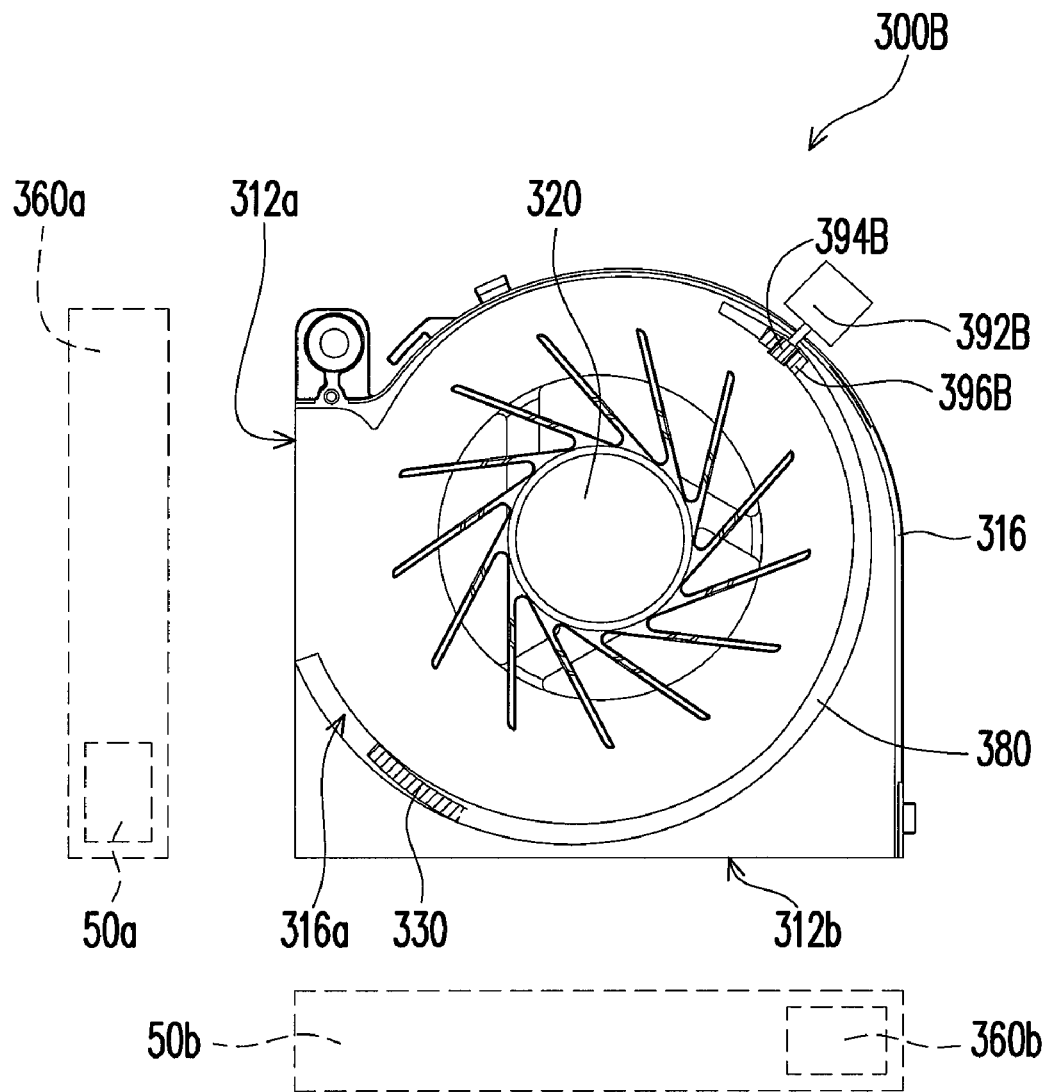
FIG. 14B illustrates a fan assembly according to still another embodiment of the present invention.

FIG. 14B illustrates a fan assembly according to another embodiment of the present invention. Referring to FIG. 14B, the present embodiment is in part similar to the embodiment of FIG. 12, and in these two embodiments, like elements will be given like numerals. Only the difference between the two embodiments is described below and those same elements are not repeated herein. In the present embodiment, the fan assembly 300B includes a motor 392B, a gear 394B, and a rack 396B. The motor 392B, gear 394B and rack 396B are considered components of a regulator. The gear 394B is connected to the motor 392B and adapted to be driven by the motor 392B to rotate. The rack 396B is mounted to the throttle valve 330 and meshes with the gear 394B to control the movement of the throttle valve 330 to thereby adjust the size of the first outlet 312a and second outlet 312b and hence the first air volume and second air volume.

In summary, the fan assembly of the present invention includes a throttle valve disposed at an outlet and controls the size of the outlet by controlling the movement of the throttle valve with a regulator. When the fan speed is changed, the throttle valve can cause expansion or concentration of the air current in response to a change in the intensity of the air current. In addition, when the fan is rotated at a fixed speed, the throttle valve can adjust the air volume through the outlet. Therefore, the user can more flexibly control the air current, thereby increasing the efficiency of the fan assembly.

In addition, in some embodiments, the housing may include multiple outlets. The throttle valve can adjust the proportion between the sizes of these outlets as well as the air volume through the outlets to enable the outlets to cool multiple heat sources, respectively. Moreover, in some embodiments, the fan assembly may further include a control element and a sensor such that the control element can control the regulator according to detected chip temperature values transmitted from the sensor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fan assembly for an electronic device, comprising:
   a housing having an outlet;
   a centrifugal fan comprising a first axle and disposed in the housing to provide an air current, the air current generating an air volume through the outlet, the direction of the air current being perpendicular to the first axle;
   a throttle valve movably disposed in the housing at the outlet; and
   a regulator connected to the throttle valve to control the movement of the throttle valve to adjust the size of the outlet.

2. The fan assembly according to claim 1, wherein the throttle valve is rotatably disposed in the housing and rotated by a driving force generated by the air current, and the throttle valve comprises a second axle about which the throttle valve rotates.

3. The fan assembly according to claim 2, wherein the regulator is a restoring member which provides a restoring force and is connected between the housing and the throttle valve to resist the driving force to control the position of the throttle valve and adjust the cross-sectional area of the outlet, the restoring member is a torsion spring connected to the second axle, the throttle valve is a fan-shaped throat portion, the throttle valve is rotated in a direction of the air current when the driving force is larger than the restoring force, and the throttle valve is rotated in a direction reverse to the direction of the air current when the driving force is smaller than the restoring force.

4. The fan assembly according to claim 1, wherein the regulator is an actuator connected to the throttle valve to drive the throttle valve to rotate and adjust the size of the outlet, thereby adjusting the air volume, and the actuator is connected to a control element such that the actuator is controlled to rotate the throttle valve, the actuator is a motor, and the throttle valve is a fan-shaped throat portion.

5. The fan assembly according to claim 4, further comprising a sensor electrically connected to the control element to enable the control element to sense a detected value, wherein the control element includes a detected value/control voltage value look-up table and is configured to look up a corresponding control voltage value in the detected value/control voltage value look-up table according to the detected value to control the actuator to rotate the throttle valve.

6. The fan assembly according to claim 1, wherein the throttle valve is rotatably disposed in the housing, the regulator comprises a first magnetic element and a second magnetic element, the first magnetic element is connected to the throttle valve, and the second magnetic element is disposed on the housing and configured to control the position of the first magnetic element to move the throttle valve thereby adjusting the size of the outlet and hence the air volume.

7. The fan assembly according to claim 6, further comprising a control element electrically connected to the second magnetic element, wherein the control element and the second magnetic element are electrically connected to a control circuit to control the second magnetic element to drive the throttle valve to move, the control element comprises a detected value/control voltage value look-up table and is electrically connected to a sensor to enable the control element to sense a detected value and look up a corresponding control voltage value in the detected value/control voltage value look-up table according to the detected value to control the second magnetic element to drive the throttle valve to move.

8. The fan assembly according to claim 1, wherein the regulator comprises a motor, a gear connected to the motor, and a rack, and the rack is mounted to the throttle valve and meshes with the gear to move the throttle valve thereby adjusting the size of the outlet and hence the air volume.

9. A fan assembly for an electronic device, comprising:
   a housing having a first outlet and a second outlet;
   a fan disposed in the housing to provide an air current, the air current generating a first air volume through the first outlet and a second air volume through the second outlet;
   a throttle valve movably disposed in the housing between the first outlet and the second outlet; and
   a regulator connected to the throttle valve to control the movement of the throttle valve thereby adjusting the size of the first outlet and the second outlet.

10. The fan assembly according to claim 9, wherein the throttle valve is rotatably disposed in the housing and rotated by a driving force generated by the air current, and the throttle valve comprises an axle about which the throttle valve rotates.

11. The fan assembly according to claim 10, wherein the regulator is a restoring member which provides a restoring force, the restoring member is connected between the housing and the throttle valve to resist the driving force to control the position of the throttle valve and adjust the cross-sectional area of the first outlet and second outlet, the restoring member is a torsion spring connected to the axle, and the throttle valve is a fan-shaped throat portion.

12. The fan assembly according to claim 11, wherein the first air volume is smaller than the second air volume when the cross-sectional area of the first outlet is smaller than the cross-sectional area of the second outlet, and the first air volume is larger than the second air volume when the cross-sectional area of the first outlet is larger than the cross-sectional area of the second outlet.

13. The fan assembly according to claim 11, wherein the throttle valve is rotated in a direction of the air current when the driving force is larger than the restoring force, and the throttle valve is rotated in a direction reverse to the direction of the air current when the driving force is smaller than the restoring force.

14. The fan assembly according to claim 9, wherein the regulator is an actuator connected to the throttle valve to drive the throttle valve to rotate and simultaneously adjust the size of the first outlet and the size of the second outlet, thereby adjusting the first air volume and the second air volume, and the throttle valve is rotatably disposed in the housing.

15. The fan assembly according to claim 14, further comprising a control element electrically connected to the actuator to control the actuator to drive the throttle valve to rotate, wherein the actuator comprises a motor and the throttle valve is a fan-shaped throat portion.

16. The fan assembly according to claim 15, further comprising a first sensor and a second sensor electrically connected to the control element to enable the control element to sense a first detected value and a second detected value, wherein the control element comprises a detected value comparison result/control voltage value look-up table and is configured to look up a corresponding control voltage value in the detected value comparison result/control voltage value look-up table according to a comparison result of the first detected value and the second detected value to thereby control the actuator to drive the throttle valve to rotate.

17. The fan assembly according to claim 9, wherein the throttle valve is rotatably disposed in the housing, the regulator comprises a first magnetic element and a second magnetic element, the first magnetic element is connected to the throttle valve, and the second magnetic element is disposed on the housing and configured to magnetically control the position of the first magnetic element to move the throttle valve thus adjusting the size of the first outlet and second outlet and hence the first air volume and second air volume.

18. The fan assembly according to claim 17, further comprising a control element electrically connected to the second magnetic element to control the second magnetic element to drive the throttle valve to move, wherein the control element and the second magnetic element are electrically connected to a control circuit.

19. The fan assembly according to claim 18, further comprising a first sensor and a second sensor electrically connected to the control element to enable the control element to sense a first detected value and a second detected value, wherein the control element comprises a detected value comparison result/control voltage value look-up table and is configured to look up a corresponding control voltage value in the detected value comparison result/control voltage value look-up table according to the comparison result of the first detected value and the second detected value to control the second magnetic element to drive the throttle valve to move.

20. The fan assembly according to claim 9, wherein the regulator comprises a motor, a gear connected to the motor, and a rack, and the rack is mounted to the throttle valve and meshes with the gear to move the throttle valve to adjust the sizes of the first outlet and the second outlet and hence the first air volume and the second air volume.

* * * * *

UNITED STATES PATENT AND TRADEMARK OFFICE
CERTIFICATE OF CORRECTION

PATENT NO. : 8,075,257 B2
APPLICATION NO. : 12/356078
DATED : December 13, 2011
INVENTOR(S) : Chi-Wei Tien et al.

It is certified that error appears in the above-identified patent and that said Letters Patent is hereby corrected as shown below:

On the Title page of the patent grant, please replace item (75) with:

(75) Inventors: Chi-Wei Tien, Taipei (TW); Chun-Hung Lin, Taipei (TW); Chien-Ming Su, Taipei (TW); Wen-Yu Wu, Taipei (TW); Min-Yuan Lin, Taipei (TW)

Signed and Sealed this
Third Day of April, 2012

David J. Kappos
*Director of the United States Patent and Trademark Office*